(12) United States Patent
Finn et al.

(10) Patent No.: US 8,789,762 B2
(45) Date of Patent: Jul. 29, 2014

(54) RFID ANTENNA MODULES AND METHODS OF MAKING

(75) Inventors: David Finn, Tourmakeady (IE); Lionel Carré, Seeg (DE)

(73) Assignee: Feinics Amatech Teoranta, Lower Churchfield, Tourmakeader, Co. Mayo (IE)

( * ) Notice: Subject to any disclaimer, the term of this patent is extended or adjusted under 35 U.S.C. 154(b) by 183 days.

(21) Appl. No.: 13/594,895

(22) Filed: Aug. 27, 2012

(65) Prior Publication Data

US 2013/0062419 A1 Mar. 14, 2013

Related U.S. Application Data

(63) Continuation-in-part of application No. 13/205,600, filed on Aug. 8, 2011, now Pat. No. 8,474,726, which is
(Continued)

(51) Int. Cl.
*G06K 19/06* (2006.01)
*H01Q 7/00* (2006.01)
*H01Q 1/22* (2006.01)
*G06K 19/077* (2006.01)
*H01F 38/14* (2006.01)

(52) U.S. Cl.
CPC ...... *H01Q 1/2225* (2013.01); *H01L 2924/3011* (2013.01); *H01L 2224/16225* (2013.01); *H01L 2224/48472* (2013.01); *H01L 2224/45147* (2013.01); *H01Q 7/00* (2013.01); *H01F 38/14* (2013.01); *H01Q 1/2216* (2013.01); *G06K 19/07794* (2013.01); *G06K 19/07754* (2013.01); *G06K 19/07718* (2013.01); *H01L 2224/48091* (2013.01); *H01Q 1/2283* (2013.01); *G06K 19/07779* (2013.01); *H01L 2224/48227* (2013.01)

USPC .......................................................... 235/492

(58) Field of Classification Search
USPC .......................................................... 235/492
See application file for complete search history.

(56) References Cited

U.S. PATENT DOCUMENTS

| 4,463,971 A | 8/1984 | Hoppe et al. |
| 5,012,236 A | 4/1991 | Troyk et al. |

(Continued)

FOREIGN PATENT DOCUMENTS

| CA | 2279176 | 7/1998 |
| DE | 39 35 364 | 8/1990 |

(Continued)

OTHER PUBLICATIONS

International Search Report and Written Opinion dated Apr. 2, 2013.

(Continued)

*Primary Examiner* — Kristy A Haupt
(74) *Attorney, Agent, or Firm* — Gerald E. Linden

(57) ABSTRACT

A winding core (WC) having a tubular body portion (B) and two ends is mounted by one of its ends to a module tape (MT), a module antenna (MA) is wound around the winding core (WC), a chip (CM) is disposed on the module tape (MT) within the winding core (WC). Connections (wb) are made, and glob-top (GT) is applied over the chip (CM), substantially filling the interior area of the winding core (WC). The module antenna (MA), winding core (WC) and chip (CM) may subsequently be overmolded with a mold mass (MM). The winding core (WC) may have a flange (F) at one end. Using the module antenna (MA) itself as a dam for the glob-top is disclosed. Double-sided and single-sided module tapes (MT) having vias, openings, or vias and openings are disclosed.

20 Claims, 12 Drawing Sheets

Related U.S. Application Data a continuation-in-part of application No. 13/294,578, filed on Nov. 11, 2011, now abandoned, which is acontinuation-in-part of application No. 13/310,718, filed on Dec. 3, 2011, now Pat. No. 8,366,009.

(60) Provisional application No. 61/373,269, filed on Aug. 12, 2010, provisional application No. 61/384,219, filed on Sep. 17, 2010, provisional application No. 61/511,990, filed on Jul. 27, 2011, provisional application No. 61/521,741, filed on Aug. 9, 2011, provisional application No. 61/533,228, filed on Sep. 11, 2011, provisional application No. 61/536,153, filed on Sep. 19, 2011, provisional application No. 61/561,938, filed on Nov. 21, 2011, provisional application No. 61/569,317, filed on Dec. 12, 2011, provisional application No. 61/586,781, filed on Jan. 14, 2012, provisional application No. 61/589,434, filed on Jan. 23, 2012, provisional application No. 61/595,088, filed on Feb. 5, 2012, provisional application No. 61/619,951, filed on Apr. 4, 2012, provisional application No. 61/624,384, filed on Apr. 15, 2012, provisional application No. 61/624,412, filed on Apr. 16, 2012, provisional application No. 61/646,369, filed on May 14, 2012, provisional application No. 61/660,668, filed on Jun. 15, 2012, provisional application No. 61/666,962, filed on Jul. 2, 2012, provisional application No. 61/693,262, filed on Aug. 25, 2012.

(56) References Cited

U.S. PATENT DOCUMENTS

| | | |
|---|---|---|
| 5,084,699 A | 1/1992 | DeMichele |
| 5,261,615 A | 11/1993 | Cuttelod |
| 5,270,717 A | 12/1993 | Schuermann |
| 5,281,855 A | 1/1994 | Hadden et al. |
| 5,393,001 A | 2/1995 | Gustafson |
| 5,572,410 A | 11/1996 | Gustafson |
| 5,574,470 A | 11/1996 | DeVall |
| 5,606,488 A | 2/1997 | Gustafson |
| 5,649,352 A | 7/1997 | Gustafson |
| 5,773,812 A | 6/1998 | Kreft |
| 5,809,633 A | 9/1998 | Mundigl et al. |
| 5,955,723 A | 9/1999 | Reiner |
| 5,969,951 A | 10/1999 | Fischer |
| 5,988,510 A | 11/1999 | Tuttle |
| 6,008,993 A | 12/1999 | Kreft |
| 6,088,230 A | 7/2000 | Finn et al. |
| 6,095,423 A | 8/2000 | Houdeau et al. |
| 6,107,920 A | 8/2000 | Eberhardt et al. |
| 6,142,381 A | 11/2000 | Finn et al. |
| 6,190,942 B1 | 2/2001 | Wilm et al. |
| 6,233,818 B1 | 5/2001 | Finn et al. |
| 6,285,342 B1 | 9/2001 | Brady et al. |
| 6,295,720 B1 | 10/2001 | Finn et al. |
| 6,310,778 B1 | 10/2001 | Finn et al. |
| 6,373,447 B1 | 4/2002 | Rostoker et al. |
| 6,375,083 B2 | 4/2002 | Fries |
| 6,378,774 B1 | 4/2002 | Emori et al. |
| 6,390,375 B2 | 5/2002 | Kayanakis |
| 6,406,935 B2 | 6/2002 | Kayanakis et al. |
| 6,424,301 B1 | 7/2002 | Johnson et al. |
| 6,460,773 B1 | 10/2002 | Kaiya et al. |
| 6,568,600 B1 | 5/2003 | Carpier et al. |
| 6,576,081 B2 | 6/2003 | Date et al. |
| 6,634,564 B2 | 10/2003 | Kuramochi |
| 6,698,089 B2 | 3/2004 | Finn et al. |
| 6,715,688 B2 | 4/2004 | Kobayashi et al. |
| 6,719,206 B1 | 4/2004 | Bashan et al. |
| 6,817,534 B2 | 11/2004 | Gray |
| 6,851,618 B2 | 2/2005 | Halope |
| 6,867,981 B2 | 3/2005 | Murohara |
| 6,881,605 B2 | 4/2005 | Lee et al. |
| 7,028,910 B2 | 4/2006 | Reignoux |
| 7,268,740 B2 | 9/2007 | Oberle |
| 7,286,053 B1 | 10/2007 | Gudeman et al. |
| 7,320,738 B2 | 1/2008 | Radenne et al. |
| 7,626,548 B2 | 12/2009 | Matsushita et al. |
| 7,692,546 B2 | 4/2010 | Camp et al. |
| 7,928,918 B2 | 4/2011 | Caruana et al. |
| 7,980,477 B2 | 7/2011 | Finn |
| 8,100,337 B2 | 1/2012 | Artigue et al. |
| 8,130,166 B2 | 3/2012 | Ayala et al. |
| 2001/0011012 A1 | 8/2001 | Hino et al. |
| 2002/0020903 A1 | 2/2002 | Kreft et al. |
| 2002/0089049 A1 | 7/2002 | Leduc et al. |
| 2002/0105232 A1 | 8/2002 | Parrault |
| 2003/0116790 A1 | 6/2003 | Kikuchi et al. |
| 2003/0155420 A1 | 8/2003 | Morrow et al. |
| 2005/0066513 A1 | 3/2005 | Kayanakis et al. |
| 2006/0054709 A1 | 3/2006 | Lee |
| 2007/0171074 A1 | 7/2007 | Camp et al. |
| 2008/0099559 A1 | 5/2008 | Lo et al. |
| 2008/0179404 A1 | 7/2008 | Finn |
| 2008/0246614 A1 | 10/2008 | Paananen |
| 2008/0283615 A1 | 11/2008 | Finn |
| 2008/0308641 A1 | 12/2008 | Finn |
| 2008/0314990 A1 | 12/2008 | Rietzler |
| 2009/0057414 A1 | 3/2009 | Brunet et al. |
| 2009/0152362 A1 | 6/2009 | Ayala et al. |
| 2009/0315320 A1 | 12/2009 | Finn |
| 2010/0176205 A1 | 7/2010 | Patrice |
| 2010/0283690 A1 | 11/2010 | Artigue et al. |
| 2011/0155811 A1 | 6/2011 | Rietzler |
| 2011/0163167 A1 | 7/2011 | Artigue et al. |
| 2012/0055013 A1 | 3/2012 | Finn |
| 2012/0061473 A1 | 3/2012 | Forster et al. |
| 2012/0064307 A1 | 3/2012 | Forster et al. |

FOREIGN PATENT DOCUMENTS

| | | |
|---|---|---|
| DE | 44 43 980 | 6/1996 |
| DE | 196 32 115 | 12/1997 |
| DE | 43 11 493 | 4/2000 |
| DE | 100 10 936 | 9/2001 |
| DE | 69706577 | 9/2001 |
| DE | 102006024247 | 11/2007 |
| DE | 199 15 765 | 10/2010 |
| EP | 0 839 360 | 5/1998 |
| EP | 0 875 039 | 11/1998 |
| EP | 0 922 289 | 6/1999 |
| EP | 0 931 295 | 7/1999 |
| EP | 0 977 145 | 2/2000 |
| EP | 1 031 939 | 8/2000 |
| EP | 1031939 | 8/2000 |
| EP | 1 325 468 | 7/2003 |
| EP | 1 352 551 | 10/2003 |
| EP | 2 120 190 | 11/2009 |
| FR | 2 765 010 | 12/1998 |
| NL | 9100347 | 3/1992 |
| WO | WO 97/04415 | 2/1997 |
| WO | WO 98/09305 | 3/1998 |
| WO | WO 9953740 | 10/1999 |
| WO | WO 2006/125916 | 11/2006 |
| WO | WO 2007/025934 | 3/2007 |
| WO | WO 2007/026077 | 3/2007 |
| WO | WO 2009/142235 | 11/2009 |
| WO | WO 2010/029218 | 3/2010 |

OTHER PUBLICATIONS

Product short data sheet, P5CD016/021/041/051 and P5Cx081 family, Secure dual interface and contact PKI smart card controller, Rev 3.2—Mar. 2011, 20 pages.

Preliminary Short Product Information, SLE 66CLX360PE(M) Family, 8/16-Bit Security Dual Interface Controller for Contact Based and Contactless Applications, Infineon, Nov. 2006, 14 pages.

SLE 66 CX126PE, short Product Overview, May 2010, 4 pages.

(56) References Cited

OTHER PUBLICATIONS

SmartMX for programmable high-security, multi-application smart cards, NXP, 2009, 2 pages.
Mifare DESFire Data Sheet Addendum, Preliminary specification, Revision 2.0, Apr. 2003, M086820_MF3ICD40_ModuleSpec, 7 pages.
Smart Card, Wikipedia, Jul. 28, 2012, 10 pages.
ISO/IEC 14443, Wikipedia, Aug. 14, 2012, 2 pages.
ISO/IEC 7816, Wikipedia, Jul. 28, 2012, 6 pages.

Dual Interface (DI) Smart Card, and Readers

AM with wire wound MA
CM and MA wire-bonded to MT using the MA as a dam to contain resin module antenna (MA) subassembly DS as WC for an AM DS slotted to accommodate wire(s) extending inwardly wire ends of MA
extend inward of WC wire ends of MA
extend outward from WC single-flange WC for MA affix WC to MT ready for winding MA MA is wound on WC install CM in WC
wire-bonding glob-top interior of WC MM over CM and MA install AM in CB foil on tape define contact pads (CP)

DIF Module with Ferrite Layer

DIF Module double-sided AM with vias through MT double-sided AM with openings through MT double-sided AM with openings and vias CP layout/assignments single-sided AM with openings single-sided AM with vias Contact Pad Layout/Assignments

US 8,789,762 B2

RFID ANTENNA MODULES AND METHODS OF MAKING

CROSS-REFERENCE(S) TO RELATED APPLICATIONS

This application ("S49") is a continuation-in-part of the following U.S. applications . . .
Ser. No. 13/205,600 filed Aug. 8, 2011 ("S34") which claims priority from . . .
  61/373,269 filed Aug. 12, 2010 ("s34ppa")
  61/384,219 filed Sep. 17, 2010 ("s35ppa")
Ser. No. 13/294,578 filed Nov. 11, 2011 ("S32"), which claims priority from . . .
  61/511,990 filed Jul. 27, 2011 ("s44ppa")
Ser. No. 13/310,718 filed Dec. 3, 2011 ("S45") which claims priority from . . .
  61/521,741 filed Aug. 9, 2011 ("s34pp2")
  61/533,228 filed Sep. 11, 2011 ("s34pp3")
  61/536,153 filed Sep. 19, 2011 ("s34pp4")
  61/561,938 filed Nov. 21, 2011 ("s34pp5")
This application ("S49") claims priority from the following US provisionals . . .
  61/569,317 filed Dec. 12, 2011 ("s46ppa")
  61/586,781 filed Jan. 14, 2012 ("s47ppa")
  61/589,434 filed Jan. 23, 2012 ("s48ppa")
  61/595,088 filed Feb. 5, 2012 ("s49ppa")
  61/619,951 filed Apr. 4, 2012 ("s48pp2")
  61/624,384 filed Apr. 15, 2012 ("s47pp2")
  61/624,412 filed Apr. 16, 2012 ("s49pp2")
  61/646,369 filed May 14, 2012 ("s47pp3")
  61/660,668 filed Jun. 15, 2012 ("s47pp4")
  61/666,962 filed Jul. 2, 2012 ("s47pp5")
  61/693,262 filed Aug. 25, 2012 ("s48pp3")

TECHNICAL FIELD

The invention relates to "secure documents" such as electronic passports, electronic ID cards and smart cards (data carriers) having RFID (radio frequency identification) chips or chip modules (CM) and operating in a "contactless" mode (ISO 14443) including dual interface (DI, or DIF) cards which can also operate in contact mode (ISO 7816-2), and more particularly to improving coupling between components within the smart card, such as between a module antenna (MA) connected with the RFID chip (CM) and a booster antenna (BA) in the card body (CB) of the smart card and inductively coupled with the module antenna (MA) and consequent improvements in the RFID chip (CM) interacting with external RFID readers.

BACKGROUND

For purposes of this discussion, an RFID transponder generally comprises a substrate, an RFID chip or chip module (CM) disposed on or in the substrate, and an antenna disposed on or in the substrate. The transponder may form the basis of a secure document such as an electronic passport, smart card or national ID card, which may also be referred to as "data carriers". The chip (CM) may be also referred to as an integrated circuit (IC).

The RFID chip (CM) may operate solely in a contactless (non-contact) mode (such as ISO 14443), or may be a dual interface (DI, DIF) chip module (CM) which may additionally be operative to function in a contact mode (such as ISO 7816-2) and a contactless mode. The RFID chip (CM) may harvest energy from an RF signal supplied by an external RFID reader device with which it communicates. The chip module (CM) may be a leadframe-type chip module or an epoxy-glass type chip module. The epoxy-glass module can be metallized on one side (contact side) or on both sides with through-hole plating to facilitate the interconnection with the antenna.

The substrate, which may be referred to as an "inlay substrate" (such as for electronic passport) or "card body" (such as for smart card) may comprise one or more layers of material such as Polyvinyl Chloride (PVC), Polycarbonate (PC), polyethylene (PE), PET (doped PE), PET-G (derivative of PE), Teslin™, Paper or Cotton/Noil, and the like.

An antenna, which may be referred to as a "card antenna" (CA), may be mounted to the inlay substrate using a sonotrode (ultrasonic tool) and electrically connected with the chip module (CM). See, for example U.S. Pat. No. 6,698,089 and U.S. Pat. No. 6,233,818, incorporated by reference herein. A typical pattern for a card antenna (CA) is generally rectangular, in the form of a flat (planar) coil (spiral) having a number of turns, disposed around the periphery of the substrate (or relevant portion thereof). See, for example, U.S. Pat. No. 7,980,477 (2011, Finn).

Rather than directly electrically connecting the RFID chip (CM) to a card antenna (CA), a module antenna (MA) may be incorporated into an antenna module (AM) comprising the RFID chip (CM) and the module antenna (MA). The module antenna (MA) may be quite small (such as approximately 15 mm×15 mm), in contrast with the card antenna (CA) (such as approximately 50 mm×80 mm). The module antenna (MA) may be inductively coupled rather than electrically connected to the card antenna (CA). In such cases, the card antenna (CA) may be referred to as a booster antenna (BA). The booster antenna (BA) may comprise a portion disposed around the periphery of the card body (CB), and another portion which may comprise a coupler coil (CC) disposed at an interior area of the card body (CB) for inductively coupling with the module antenna (MA). The terms card antenna (CA) and booster antenna (BA) may be used interchangeably herein.

US 20120038445 (2012, Finn) discloses a transponder with an antenna module (AM) having a chip module (CM) and an antenna (MA); a booster antenna (BA) having outer and inner antenna structures (D,E) in the form of flat coils disposed around the periphery of the card body (CB). The antenna module (AM) may be positioned so that its antenna (MA) overlaps only one of the antenna structures or the second antenna structure, for inductive coupling thereto.

U.S. Pat. No. 5,084,699 (1992, Trovan) entitled Impedance Matching Coil Assembly For An Inductively Coupled Transponder. Attention is directed to FIG. 5. A coil assembly for use in an inductively powered transponder includes a primary coil (156) and a secondary coil (158) wrapped around the same coil forming ferrite rod (160). The primary coil's leads (162) are left floating while the secondary coil's leads (164) are connected to the integrated identification circuit of the transponder.

U.S. Pat. No. 5,955,723 (1999, Siemens) entitled Contactless Chip Card discloses a data carrier configuration includes a semiconductor chip. Attention is directed to FIG. 1. A first conductor loop (2) is connected to the semiconductor chip (1) and has at least one winding and a cross-sectional area with approximately the dimensions of the semiconductor chip. At least one second conductor loop (3) has at least one winding, a cross-sectional area with approximately the dimensions of the data carrier configuration and a region forming a third loop (4) with approximately the dimensions of the first conductor loop (2). The third loop (4)

inductively couples the first conductor loop (2) and the at least one second conductor loop (3) to one another.

U.S. Pat. No. 6,378,774 (2002, Toppan) discloses a smart card comprising an IC module and an antenna for non-contact transmission. The IC module has both a contact-type function and a non-contact-type function. The IC module has a first coupler coil (8), the antenna has a second coupler coil (3). The first and second coupler coils are disposed to be closely coupled to each other, and are coupled in a non-contact state by transformer coupling. Various ways of forming the first coupler coil (8) are shown. For example, in FIG. 14, the first coupler coil (8) is wound around a coil frame (17), which is provided around the seal resin (16) of IC chip (6).

U.S. Pat. No. 7,928,918 (2011, Gemalto) entitled Adjusting Resonance Frequency By Adjusting Distributed Inter-Turn Capacity discloses a method for adjusting frequency tuning of a resonant circuit with turns having a regular spacing generating stray inter-turn capacity.

U.S. Pat. No. 8,130,166 (2012, Assa Abloy) discloses Coupling Device For Transponder And Smart Card With Such Device. Attention is directed to FIG. 6. A coupling device is formed by a continuous conductive path having a central section (12) and two extremity sections (11, 11'), the central section (12) forming at least a small spiral for inductive coupling with the transponder device, the extremities sections (11, 11') forming each one large spiral for inductive coupling with the reader device.

US2010/0176205 (2010, SPS) entitled Chip Card With Dual Communication Interface. Attention is directed to FIG. 4. A card body (22) includes a device (18) for concentrating and/or amplifying electromagnetic waves, which can channel the electromagnetic flow received, in particular, from a contactless chip card reader toward the coils of the antenna (13) of the microelectronic module (11). The device (18) for concentrating and/or amplifying electromagnetic waves may consist of a metal sheet disposed in the card body (22) below the cavity (23) receiving the microelectronic module (11), or may consist of an antenna consisting of at least one coil, disposed in the card body (22) below the cavity (23) receiving the microelectronic module (11).

The following patents and publications are referenced, and may be "incorporated by reference", herein: CA 2,279,176 (1998, PAV); DE 39 35 364 (1990, ADE); DE 43 11 493 (2000, Amatech); NL 9100347 (1992, 'Nedap'); U.S. Pat. No. 5,773,812 (1998, ADE); U.S. Pat. No. 6,008,993 (1999, ADE); U.S. Pat. No. 6,142,381(2000, Finn et al.); U.S. Pat. No. 6,190,942 (2001, "PAV"); U.S. Pat. No. 6,095,423 (2000, Siemens); U.S. Pat. No. 6,310,778 (2001, Finn et al.); U.S. Pat. No. 6,406,935 (2002, ASK); U.S. Pat. No. 6,719,206 (2004, On Track); U.S. Pat. No. 7,320,738 (2008, FCI); U.S. Pat. No. 8,100,337 (2012, "SPS"); US 2008/0283615 (2008, Finn); US 2008/0308641 (2008, Finn); US 2008/0314990 (2008, Smartrac); US 20090057414; US 2002/0020903 (2002, ADE); US 20100283690(2010, SPS); US 2011/0163167 (2011, SPS).

SUMMARY

It is an object of the invention to provide improved techniques for manufacturing antenna modules (AM) for secure documents such as smart cards (SC).

A winding core (WC) having a tubular body portion (B) and two ends is mounted by one of its ends to a module tape (MT), a module antenna (MA) is wound around the winding core (WC), a chip (CM) is disposed on the module tape (MT) within the winding core (WC). Connections (wb) are made, and glob-top (GT) is applied over the chip (CM), substantially filling the interior area of the winding core (WC). The module antenna (MA), winding core (WC) and chip (CM) may subsequently be overmolded with a mold mass (MM). The winding core (WC) may have a flange (F) at one end.

According to an embodiment of the invention, an antenna module (AM) for a smart card (SC) may comprise: a module tape (MT); a chip (CM) disposed on a surface of the module tape (MT); and a module antenna (MA) disposed on the surface of the module tape (MT), and connected with the chip (CM); characterized by: a support structure (DS, WC) secured to the surface of the module tape (MT), serving as a winding core for the module antenna (MA) and as a dam for glob-top (GT) covering the chip (CM); wherein the support structure (DS, WC) comprises a tubular body portion (B) having two opposite open ends, one of which is secured to the surface of the module tape (MT), the other of which is a free end. The support structure (WC) may have a flange (F) disposed around the free end of the body portion (B). The module antenna (MA) may be disposed external to the body portion (B); and the chip (CM) may be disposed on the module tape (MT) internal to the body portion (B). At least one slot (S) may extending through the body portion (B) to allow corresponding at least one end of the module antenna (MA) to pass through the body portion (B) from external the body portion (B) to internal the body portion (B). Glob-top may cover at least the chip (CM), within the support structure. A mold mass (MM) may cover the chip (CM) the support structure (DS, WC) and the module antenna (MA). Contact pads (CP) may be disposed on an opposite surface of the module tape (MT) for a contact interface.

A smart card (SC) may comprise the antenna module (AM) disposed in a card body (CB) having a booster antenna (BA) having an outer portion disposed around a periphery of the card body (CB) and a coupler coil (CC) disposed at an interior area of the card body (CB); wherein the antenna module (AM) is disposed at the interior area of the card body (CB) for inductive coupling of the module antenna (MA) with the coupler coil (CC). A recess (R) may be provided in the card body (CB) for receiving the antenna module (AM). At least a portion of the coupler coil (CC) may be embedded in the recess (R).

According to an embodiment of the invention, a method of making an antenna module (AM) may comprise: affixing a tubular support structure (DS, WC) having two opposite open ends on a surface of a module tape (MT); and winding a wire for a module antenna (MA) around the tubular support structure (DS, WC). The module antenna (MA) may be wound using a flyer winding technique. Before winding the wire around the support structure, a first end of the wire for forming the module antenna (MA) may be secured to a first pin; and a first end portion of the wire may be passed over a first bond pad (BP) on the module tape (MT). After winding the wire around the support structure, a second end portion of the wire may be passed over a second bond pad (BP) on the module tape (MT); and a second end of the wire for forming the module antenna (MA) may be secured to a second pin. The first and second end portions may be connected to the first and second bond pads.

According to an embodiment of the invention, a method of making an antenna module (AM) may comprise: mounting a module antenna (MA) to a module tape (MT); mounting and connecting a chip (CM) to the module tape (MT); covering the chip (CM) and its connections with resin (GT); characterized by: the chip (CM) and its connections are covered with resin (GT) by filling an interior area of the module antenna (MA) with resin after mounting the module antenna (MA) and after mounting and connecting the chip (CM).

A smart card (SC) may comprise a card body (CB) and an antenna module (AM). The card body (CB) may have a booster antenna (BA) comprising windings disposed around the periphery of the card body (CB) and a coupler coil (CC) disposed at an interior area of the card body (CB). An antenna module (AM) having a module antenna (MA), may be disposed in a recess of the card body (CB), within the interior of the coupler coil (CC), and may be substantially coplanar with the coupler coil (CC), so that the module antenna (MA) couples inductively (transformer coupling) with the coupler coil (CC).

Various configurations of double-sided and single-sided module tapes (MT) having vias (or plated through holes), openings, or vias and openings are disclosed.

BRIEF DESCRIPTION OF THE DRAWINGS

Reference will be made in detail to embodiments of the disclosure, non-limiting examples of which may be illustrated in the accompanying drawing figures (FIGs). The figures may generally be in the form of diagrams. Some elements in the figures may be exaggerated, others may be omitted, for illustrative clarity. Some figures may be in the form of diagrams. Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein.

DETAILED DESCRIPTION

Figure 1:
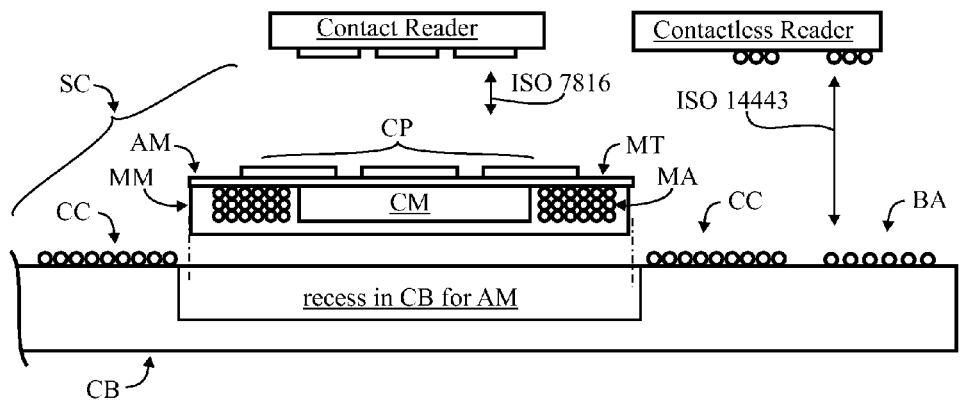
FIG. 1 is a cross-sectional view of a portion of a dual interface (DI) smart card (SC), also showing external "contact" and "contactless" reader devices.

Various embodiments will be described to illustrate teachings of the invention(s), and should be construed as illustrative rather than limiting. Any dimensions and materials or processes set forth herein should be considered to be approximate and exemplary, unless otherwise indicated.

In the main hereinafter, transponders in the form of secure documents which may be smart cards or national ID cards may be discussed as exemplary of various features and embodiments of the invention(s) disclosed herein. As will be evident, many features and embodiments may be applicable to (readily incorporated in) other forms of secure documents, such as electronic passports. As used herein, any one of the terms "transponder", "smart card", "data carrier", and the like, may be interpreted to refer to any other of the devices similar thereto which operate under ISO 14443 or similar RFID standard. The following standards are incorporated in their entirety by reference herein:

ISO/IEC 14443 (Identification cards—Contactless integrated circuit cards—Proximity cards) is an international standard that defines proximity cards used for identification, and the transmission protocols for communicating with it.

IS O/IEC 7816 is an international standard related to electronic identification cards with contacts, especially smart cards.

A typical data carrier described herein may comprise (i) an antenna module (AM) having an RFID chip or chip module (CM) and a module antenna (MA), (ii) a card body (CB) and (iii) a booster antenna (BA) disposed on the card body (CB) to enhance coupling between the module antenna (MA) and the antenna of an external RFID "reader". When "chip module" is referred to herein, it should be taken to include "chip", and vice versa, unless explicitly otherwise stated. The module antenna (MA) may comprise a coil of wire, conductive traces etched or printed on a module tape (MT) substrate for the antenna module (AM), or may be incorporated directly on the chip itself.

The booster antenna (BA) may be formed by embedding wire in an inlay substrate or card body (CB). However, it should be understood that the antenna may be formed using a processes other than by embedding wire in a substrate, such as additive or subtractive processes such as printed antenna structures, coil winding techniques (such as disclosed in U.S.

Pat. No. 6,295,720), antenna structures formed on a separate antenna substrate and transferred to the inlay substrate (or layer thereof), antenna structures etched (including laser etching) from a conductive layer on the substrate, conductive material deposited on the substrate or in channels formed in the substrate, or the like. When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

Generally, coupling between the module antenna (MA) and the antenna of an external RFID reader may be enhanced by incorporating a booster antenna (BA) on the card body (CB). In some respects, a booster antenna (BA) is similar to a card antenna (CA). However, in contrast with a card antenna (CA) which is directly electrically connected with the RFID chip or chip module (such as in U.S. Pat. No. 7,980,477), the booster antenna (BA) is inductively coupled with the module antenna (MA) which may be connected with the RFID chip (CM). Such inductive coupling may be more difficult to accomplish than a direct electrical connection.

As used herein, the term "coupling" (and variants thereof) refers to inductive, magnetic, capacitive or reactive coupling (including combinations thereof, any of which may be referred to as "inductive coupling") between two elements relying on the generation of an electromagnetic field by a given element and the reaction to (interaction with) the field(s) by another element. In contrast thereto, the term "connecting" (and variants thereof) refers to two elements being electrically connected with one another wherein the interaction between the two elements results from the flow of electrons between the two elements. Typically, two elements which are inductively coupled with one another are not electrically connected with one another. Elements which are coils of wire such as a module antenna MA and a coupler coil CC disposed near each other are generally inductively coupled with one another, without any electrical connection between the two elements. In contrast thereto, the module antenna MA is generally electrically connected with the RFID chip (CM) element. The windings and coils of the booster antenna BA, such as outer winding OW, inner winding IW and coupler coil CC elements, are generally electrically connected with one another, but may also exhibit inductive coupling with one another. The module antenna MA and coupler coil CC are not electrically connected with one another, but are inductively coupled (or "transformer coupled") with one another.

The booster antenna BA (and other features) disclosed herein may increase the effective operative ("reading") distance between the antenna module AM and an external contactless reader with capacitive and inductive coupling. With reading distances typically on the order of only a few centimeters, an increase of 1 cm can represent a significant improvement.

Dual Interface (DI) Smart Card and Readers

FIG. 1 illustrates a dual interface (DI) smart card SC comprising:
- an RFID chip (or chip module) CM, which may be a dual interface (DI) chip or chip module, disposed on an underside of a substrate or module tape MT (or chip carrier tape, or metal leadframe.);
- a number (such as six) of contact pads CP for implementing a contact interface (ISO 7816) on a top side of the module tape MT; and
- a module antenna MA disposed on the underside of the module tape MT, typically formed from an etched conductor or wire, in a spiral (coil) pattern.

The module tape MT supports and effects interconnections between the RFID chip CM, contact pads CP and module antenna MA, and may be single-sided, having metallization on only one side, or double-sided, having metallization on both sides.

The RFID chip CM may be connected in any suitable manner, such as flip-chip connected or wire bonded to the module tape MT.

The RFID chip CM and module antenna MA may be overmolded by a mold mass MM, for protecting the CM and MA components, and interconnections.

As used herein, "chip module" includes one or more bare semiconductor dice (chips), including integrated circuit (IC) chips. A "hybrid" chip module may comprise a chip for contact interface and a chip for contactless interface, or the like. Reference is made to U.S. Pat. No. 6,378,774 (2002, Toppan) for an example of a DIF chip solution, and to US 2010/0176205 (2010, SPS) for an example of a two chip solution wherein one chip performs the contact function and the other chip performs the contactless function.

A ferrite element (film or layer) may be incorporated into the antenna module AM, between the contact pads CP and the module antenna MA to reduce attenuating effects which may be caused by the conductive contact pads CP.

Together, the RFID chip CM, chip tape MT, contact pads CP and module antenna MA constitute an "antenna module" AM.

The smart card SC further comprises:
- a substrate which for smart cards may be referred to as a "card body" CB. (For an electronic passport, the substrate would be an "inlay substrate".)
- a booster antenna BA (or card antenna CA) is shown disposed around (just within) the periphery of the card body CB, typically in the form of a rectangular, planar spiral having a number of turns.

As used herein, the term card body CB is intended to embrace any substrate supporting the booster antenna BA and receiving the antenna module AM. A recess may be provided in the card body CB for receiving the antenna module AM.

The smart card may be referred to as a "data carrier", or "transponder", or the like.

Some exemplary and/or approximate dimensions, materials and specifications may be:

Module Tape (MT): epoxy-based tape, 60 µm thick

Chip Module (CM): NXP SmartMx or Infineon SLE66, or other

Antenna Module (AM): 15 mm×15 mm and 300 µm thick

Module Antenna (MA): several windings of approximately 50 µm copper wire, surrounding the chip module CM.

Card Body CB: approximately 54 mm×86 mm, 810 µm thick, polycarbonate (PC). The card body and its card antenna (CA, or booster antenna BA) are significantly (such as 20 times) larger than the chip module CM and its module antenna MA.

Booster Antenna BA: 3-12 turns of 112 µm copper, self-bonding wire, ultrasonically embedded in the card body CB. Alternatively, the booster antenna BA may comprise insulated 80 µm copper wire, disposed in a spiral pattern approximately 46 mm×76 mm (slightly smaller than the card body CB), pitch of the turns 300 μm, exhibiting a resonant frequency of 13.56 MHz. The optimized self-resonance frequency of the booster antenna BA may be approximately 13~17 MHz.

An example of a booster antenna with external sections forming a large spiral (11, 11') and a central portion forming a small spiral (12) may be found in U.S. Pat. No. 8,130,166 (2012, "AssaAbloy"), incorporated by reference herein. The large spiral is comparable (or analogous) to the BA in FIG. 1, the small spiral is comparable to the CC in FIG. 1.

An example of a booster antenna with an antenna coil (4) and a coupler coil (3) may be found in U.S. Pat. No. 6,378,774 (2002, "Toppan") incorporated by reference herein. The antenna coil is comparable (or analogous) to the BA in FIG. 1, the coupler coil is comparable to the CC in FIG. 1.

The present invention is not limited to the use of any specific booster antenna, rather it is directed to particulars of the antenna module AM and its manufacture.

To enhance coupling between the module antenna MA and the booster antenna BA, a material exhibiting electromagnetic coupling properties, such as ferrite, may be disposed as a thin film on surface of the card body CB or may be incorporated or embedded as particles in the card body, or both (film and particles), in any desired pattern. The use of ferrite as a material to enhance coupling or to shield (prevent) coupling is discussed herein as exemplary of a material exhibiting high electromagnetic permeability, often being used in one form or another in conjunction with antennas. See, for example, U.S. Pat. No. 5,084,699 (1992, "Trovan").

Additional layers (not shown), such as cover layers, may be laminated to the card body CB to complete the construction of the smart card.

The antenna module (AM) may be disposed in the card body (CB), such as in a milled recess so that its module antenna MA overlaps, or is within, is substantially coplanar with or on another level from the coupler coil CC. See, for example, U.S. Pat. No. 6,378,774 (2002, Toppan), incorporated in its entirety by reference herein.

FIG. 1 further illustrates a contact reader having contacts for interacting (providing power and exchanging data) with the chip module CM via the contact pads CP in a contact mode (ISO 7816), and a contactless reader having an antenna for interacting with the chip module CM via the booster antenna BA and the module antenna MA (alternatively via a card antenna CA) in a contactless mode (ISO 14443).

An embodiment of an Antenna Module (AM)

Figure 1A:
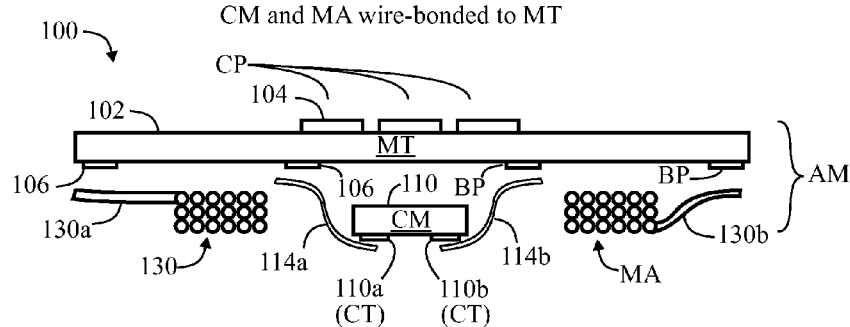
FIGS. 1A and 1B are cross-sectional views of an antenna modules (AM) that may be used in the smart card (SC) of FIG. 1, according to some embodiments of the invention.

FIG. 1A shows an antenna module (AM) 100 having an RFID chip (CM) 110 and a wound wire module antenna (MA) 130, both of which may be wire bonded to bond pads (BP) 106 on a lower surface of a module tape (MT) 102. More particularly, an epoxy glass substrate (MT) 102 having a number of contact pads (CP) 104 on its top (as viewed) surface for making a contact interface with an external reader in a "contact mode" of operation, and a number of bond pads (BP) 106 disposed on an opposite surface of the module tape (MT) 102;

The chip (CM) 110 may be mounted to the underside (as viewed) of the module tape (MT) 102 with its terminals (CT) 110a, 110b connected such as by conventional wire bonding to selected ones of the bond pads (BP) 106 on the underside (as viewed) of the module tape (MT) 102.

Only two of the wire bond connections 114a and 114b are shown, for illustrative clarity.

a module antenna (MA) 130 comprising (for example) several turns of wire, such as in a 3×6 configuration (3 layers, each layer having 6 turns), and having two ends 130a and 130b. The module antenna 130 may be connected by its ends 130a, 130b such as be thermo compression bonding to two of the bond pads (BP) 106 on the underside of the module tape (MT) 102, as illustrated.

Figure 1B:
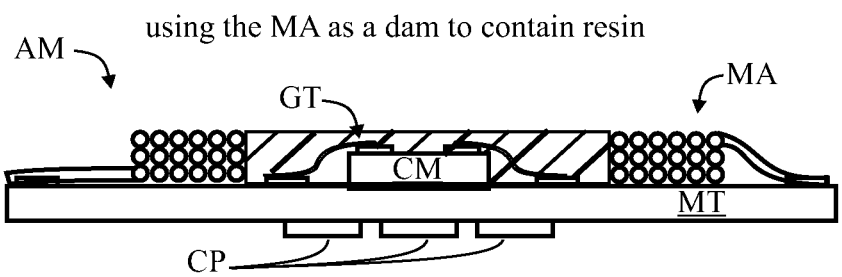

To protect the wire bonds (connections) between the chip terminals CT and the bond pads BP, after mounting the module antenna MA to the module tape MT, and after mounting and connecting the chip CM to the module tape MT (either before or after mounting the module antenna MA), the interior area of the module antenna MA may be filled with resin GT, the module antenna MA acting as a "dam" to contain the resin GT. See FIG. 1B The module antenna MA and its ends, as well as the chip CM and its connections (which may already be covered with resin GT) may be overmolded with a mold mass (MM).

The aggregate of the elements described above, generally the module tape (MT) 102, chip module (CM) 110 and module antenna (MA) 130 may be referred to as an "antenna module" (AM) 100.

In FIG. 1A, the module tape MT may be referred to as "double sided" because it has conductive elements formed in metallic layers (metallization) on both the top and bottom surfaces thereof (contact pads CP on the top surface, bond pads BPs on the bottom surface. Conductive elements, such as vias, internal to the module tape MT are omitted, for illustrative clarity. The module tape may alternatively be "single sided" having metallization on only side thereof, such as only on the top (face-up) side, for the contact pads CP. For a single sided tape, openings may extend through the module tape MT for making connections from the chip CM and/or module antenna MA disposed on the underside of the module tape MT to the back surfaces of selected ones of the contact pads CP on the top surface of the module tape MT. Some examples of antenna modules AM based on double sided and single sided module tapes are set forth below (FIGS. 7A-7G).

Figure 1C:
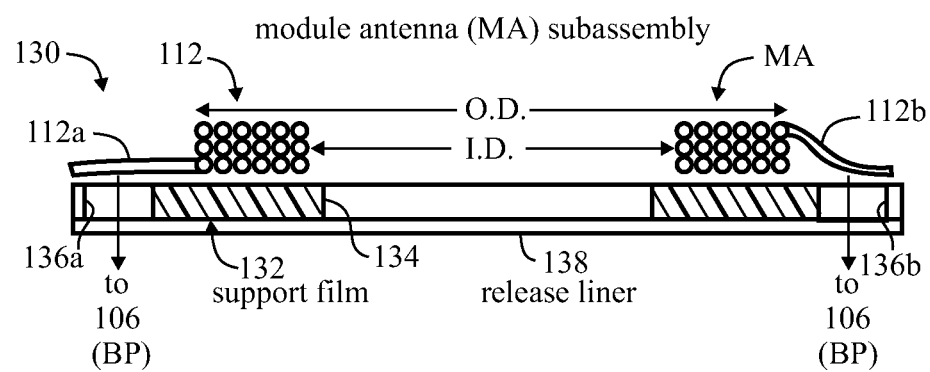
FIG. 1C is a cross-sectional view of a module antenna (MA) subassembly that can be used with some of the antenna modules (AM) disclosed herein, according to the invention.

FIG. 1C illustrates a module antenna (MA), or coil subassembly 130, that can be used in antenna modules disclosed herein, such as (but not limited to) the antenna module of FIG. 1A. A coil of wire 112 for the module antenna (MA) may be wound, using any suitable coil-winding tool, and disposed on a film support layer 132. The module antenna MA may comprise several turns of wire, and may be in the form of a ring (cylinder), having an inner diameter (ID) of approximately 9 mm, and an outer diameter (OD) of approximately 10 mm.

The film support layer 132 may be nitrile film, 60 μm thick and have overall outer dimensions of approximately 10-15 mm×10-15 mm, or approximately twice as large (across, in one dimension) as the module antenna MA which will be mounted thereto. A central opening 134 may be provided through the film 132, generally aligned with the position of the module antenna MA, and having a diameter which is nearly as large as the ID of the module antenna MA. The opening 134 may be formed by a punching operation. The opening 134 is for accommodating a chip CM (such as 110, FIG. 1A) and its wire bonds when the antenna module AM is assembled.

Two openings 136a and 136b may be provided (in the same punching operation as the central opening 134) through the film 132 for accommodating bonding of the antenna wire ends 112a and 112b, respectively, to the bond pads BP (106, FIG. 1A) on the module tape MT (102).

A release liner 138 may be provided on one side of the film 132, such as the side opposite the module antenna MA. The central opening 134 may or may not extend through the release liner 138, which may be paper, having a thickness of approximately 60 µm.

After being mounted to the module tape MT (102), and after the chip CM (110) is mounted and connected, the module antenna MA 112 may be filled with resin to protect the chip CM and its connections. The module antenna MA may be connected before connecting the chip CM so as to avoid damaging the chip CM connections.

Winding the Module Antenna on a Dam Structure

Figure 2:
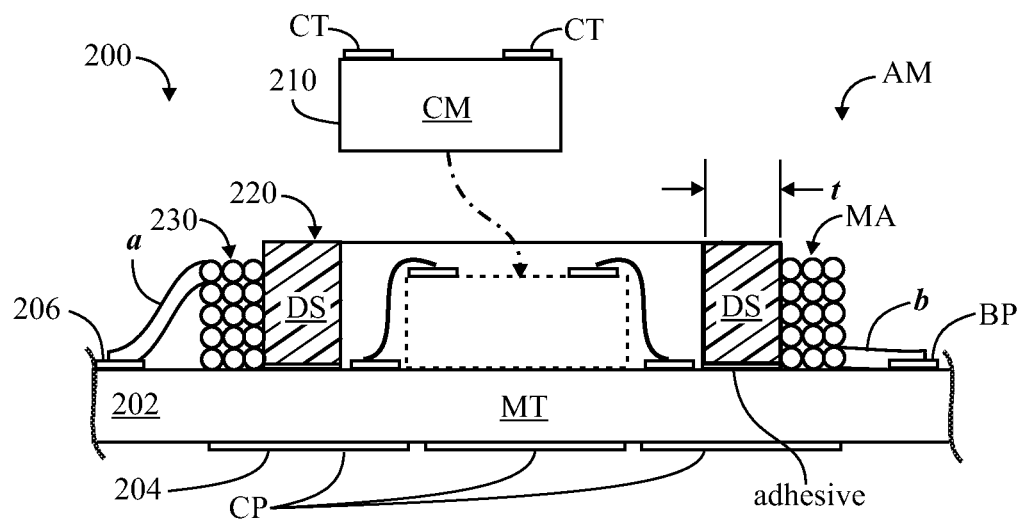
FIG. 2 is a cross-sectional view of an antenna module (AM), according to an embodiment of the invention.

FIG. 2 shows that a dam structure (or simply "dam") DS 220 may be disposed on the underside (top, as viewed) of the module tape MT 202, and affixed thereto (such as with an adhesive). (The module tape MT 202 is illustrated inverted in contrast with FIGS. 1, 1A, the contact pads CP 204 being on the bottom, as viewed, in this figure.)

The dam DS 230, which may be referred to as a "winding core WC" or a "support structure" or simply as a "ring", has an elongate tubular body portion B and two opposite open ends 230a and 230b, and may be cylindrical (as illustrated) or substantially rectangular in cross-section (or any other suitable shape). One end 230b of the body portion B is mounted to the module tape MT, using a suitable adhesive, the other end 230a is a free end (un-mounted). The dam DS may be formed of a plastic material such as Mylar, having a thickness T of approximately 200 µm. The inner diameter (ID) of the dam DS may be approximately 7 mm, the outer diameter (OD) of the dam DS may be approximately 8 mm.

Although shown as round (cylindrical), the cross-section of the dam DS may be substantially rectangular, or other suitable shape (for winding an module antenna MA thereupon), in which case "ID" would be inner dimension, and "OD" would be outer dimension of the body portion B.

A module antenna MA 230 (compare 130) having several layers and turns of self-bonding wire may be wound on the dam DS. The dam DS should have a height 'h' which is at least as high as the resulting module antenna MA, such as approximately 350 µm. The dam DS may be impregnated with ferrite to increase the inductance of the module antenna MA. A fixture (not shown) may be used to support the DS during winding the module antenna MA. The resulting interim product comprising a module antenna MA and dam DS mounted to a module tape MT, may be considered to be a subassembly for an antenna module AM. The two ends a, b (compare 112a, 112b) of the module antenna MA are shown, extending outwardly, to bond pads BP 206 (compare 106) on the surface of the module tape MT.

An RFID chip CM 210 (compare 110) may be subsequently be mounted to surface of the module tape MT, within the interior of the dam DS and wire-bonded from its terminals CT to bond pads BP on the underside (top, as viewed in FIG. 2) of the module tape MT. Then, glob-top potting compound GT (not shown) may be applied within the interior of the dam DS to protect the chip CM and wire bonds, resulting in a substantially complete antenna module AM 200. The RFID chip CM and module antenna MA may be overmolded by a mold mass MM (not shown, see FIG. 1), for protecting the chip CM and module MA components, and respective interconnections to bond pads BP on the module tape MT, completing the antenna module AM.

Figure 2A:
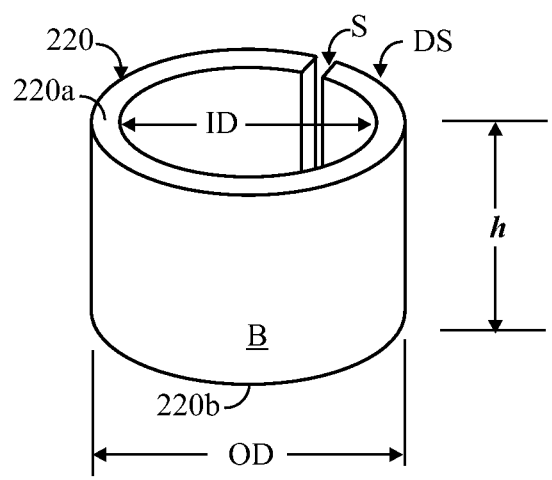
FIG. 2A is a perspective view of a dam structure (DS) component for the antenna module (AM) of FIG. 2.

FIG. 2A shows that at least one slot S 232 may be provided through the body portion B of the dam DS (winding core WC) to accommodate corresponding at least one end (a, b) of the module antenna MA wire (not shown) passing therethrough, inwardly, from external to the body portion B to the "interior" space enclosed by the dam DS. One or both ends (a, b) of the module antenna MA may extend inwardly, through one or two slots in the body portion B (two ends can extend through a single slot, at different levels) so that the ends (a, b) terminate in an area on the module tape MT enclosed by the dam DS. The slot(s) S should be sized to (wide enough) accommodate the diameter of the antenna wire passing therethrough. Having the ends of the antenna wire terminate interior to the dam DS has the advantage that they can be protected by the same glob-top GT that protects the chip CM (see FIG. 4E).

Antenna Modules Formed on 35 mm Chip Carrier Tape

Figure 2B:
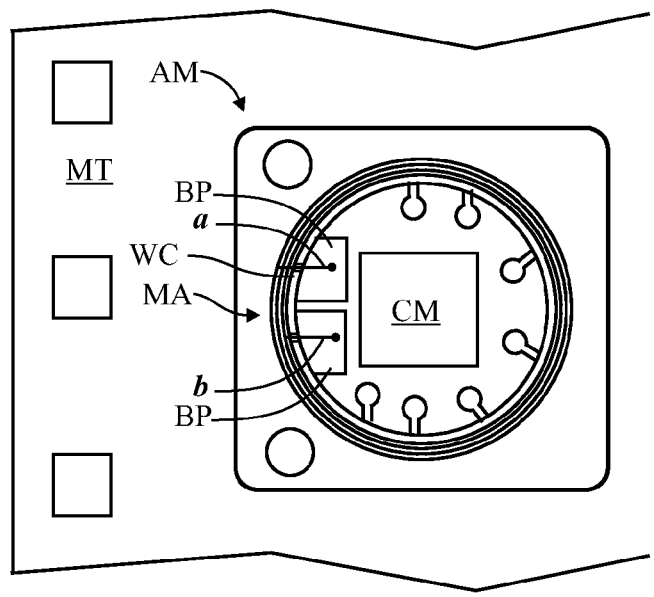
FIGS. 2B, 2C are plan views of the underside of a module tape (MT) for an antenna module (AM), according to some embodiments of the invention.

FIG. 2B illustrates a technique for forming one of many module antennas MA on a winding core WC on a 35 mm chip carrier tape (module tape MT). The two ends a, b of the module antenna MA wire may extend inward (such as though one or more slots in the winding core WC), for bonding to bond pads BP disposed on the module tape MT internal to the winding core WC. Alternatively, the winding core WC may be omitted, and the module antenna MA may be an air-core coil.

Figure 2C:
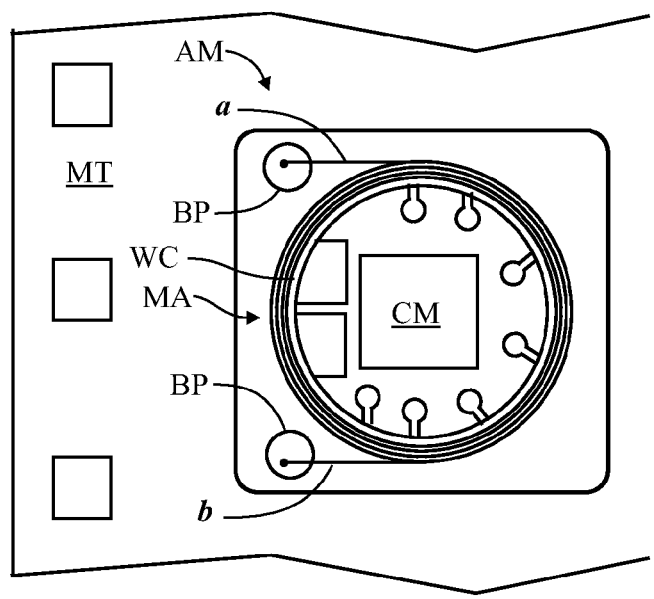

FIG. 2C illustrates a technique for forming one of many module antennas MA on a winding core WC on a 35 mm chip carrier tape (module tape MT). The two ends a, b of the module antenna MA wire may extend outward for bonding to bond pads BP disposed on the module tape MT external to the winding core WC (in the manner shown in FIG. 2). Alternatively, the winding core WC may be omitted, and the module antenna MA may be an air-core coil.

In FIGS. 2B and 2C, a square pad is shown for receiving the chip CM. A number of smaller bond pads are shown inside the winding cores WC which are connected internally to the module tape to the contact pads CP (not shown) on the face-up side of the module tape MT, and various contact terminals of the chip may be wire bonded thereto, followed by glob-top filling of the winding core WC to protect the wire bonds. In FIGS. 2B and 2C, some interconnects are shown, others may be omitted, for illustrative clarity.

"Flyer" Coil Winding

Figure 3:
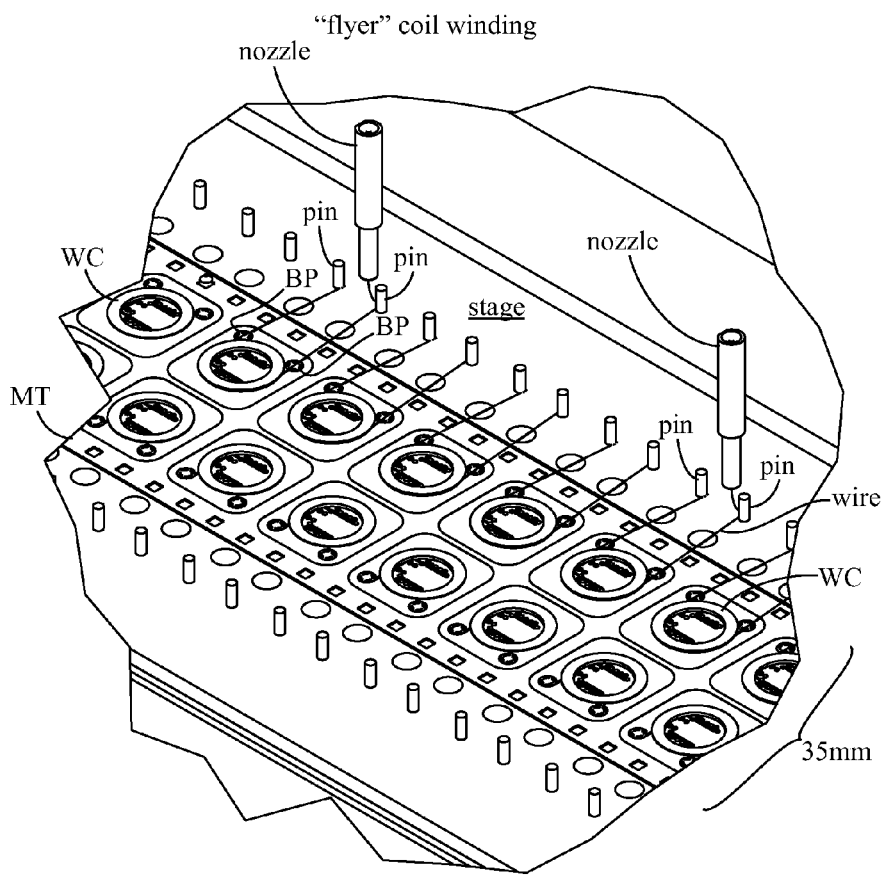
FIG. 3 is a perspective view and FIG. 3A is a plan view of techniques for forming the module antennas (MAs) of antenna modules (AMs), according to some embodiments of the invention.

FIG. 3 illustrates a plurality (approximately fifteen) of module antennas MA, such as the type shown in FIG. 2C (ends extending outward from WC) being wound on winding cores WC, on a 35 mm chip carrier tape (module tape MT). The winding cores WC may be disposed in two rows, two winding cores WC conveniently fitting side-by-side across the width of the 35 mm carrier tape. The 35 mm chip carrier tape may advance along a stage, stopping to have a number (such as two) of modules antennas MA wound at a time. A plurality (such as fifteen) of pairs of retractable "fixation" pins extend from the stage, adjacent the 35 mm carrier tape, on both sides thereof, each pair of pins being associated with each of the (fifteen) winding cores WC. A lesser number (fewer), such as two, of nozzles may be provided for supplying and winding the wire for the module antenna MA around a like number (such as two) of wire cores WC.

Generally, to form a given module antenna MA, the nozzle may first wrap a first end of the wire around a first of the pair of pins, securing (anchoring, "fixing") the first end of the wire to the first pin. The nozzle then moves towards the winding core WC, a first end portion of the wire extending (passing) over (across) a first of two bond pads BP on the module tape MT. Then the nozzle "flies" (orbits) around the winding core WC, a number (such as twenty) of times, winding the wire around the winding core WC—hence, the nomenclature "flyer" winding technique. After completing the designated number (such as twenty) of turns, the nozzle heads away from the winding core WC, a second end portion of the wire passing over a second of the two bond pads for the module antenna MA, to secure (tie off) the second end of the wire on the second of the pair of pins. Then the end portions of the wire passing over the two bond pads BP for the module antenna MA may be bonded to the respective bond pads.

It may be convenient to first form a plurality of module antennas MA, before bonding the end portions of the module antennas BP. Note in the figure that several /(six) module antennas MA have already been formed, with their two end portions extending over bond pads BP and tied off to a corresponding pairs of pins. Then, in a subsequent step, the end portions of the module antennas MA can be bonded (such as using a thermode) to the respective bond pads BP. After completing formation of the module antennas MA, residual portions (between the bond pads BP and associated pins) of the ends of the wire may be cut, the pins retracted, and "waste" wire removed such a with a suction system.

The formation of the module antenna MAs and bonding of their end portions to respective bond pads BP may be performed prior to inserting the chip CM onto module tape MT. By completing these steps before wire bonding of the chip CM (see, for example, FIG. 4D), the wire bonds to the chip CM will not disturbed during bonding of the ends of the module antenna MA.

Figure 4:
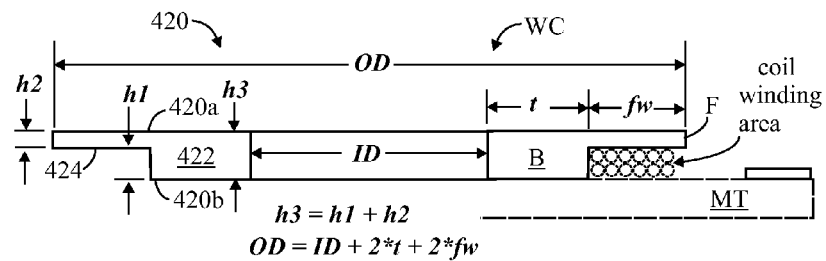
FIG. 4 is a cross-sectional view of a winding core WC upon which a module antenna may be wound, according to an embodiment of the invention.

The flyer winding technique illustrated in FIG. 3 is applicable to winding a module antenna MA on the dam structure DS of FIGS. 2,2A, as well as on the dam structure WC of FIG. 4.

The following patent relating to flyer winding are incorporated by reference herein: U.S. Pat. No. 5,261,615 (1993, Gustafson); U.S. Pat. No. 5,393,001 (1995, Gustafson); U.S. Pat. No. 5,572,410 (1996, Gustafson); U.S. Pat. No. 5,606,488 (1997, Gustafson); U.S. Pat. No. 5,649,352 (1997, Gustafson)

Figure 3A:
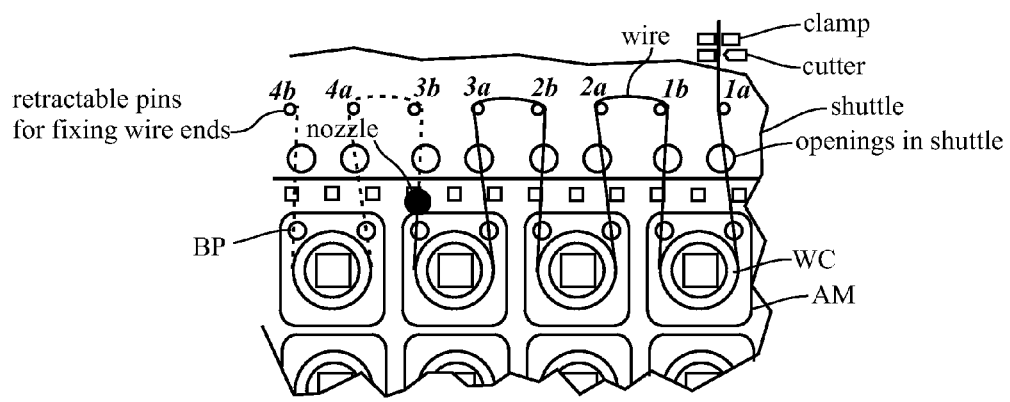

FIG. 3A shows some additional detail and/or variation(s) on the technique described above. A row of four antenna modules (AMs) being formed are shown disposed along one side of a 35 mm carrier tape. A plurality of tubular, open-ended support structures (WC, DS) have been placed at a corresponding plurality of sites for forming a corresponding plurality of antenna modules AMs. A plurality of retractable fixation pins for the wire ends are integrated into the shuttle (stage). A pair of these pins (labeled #a, #b) is located adjacent the carrier tape at each corresponding site for an antenna modules. An exemplary method of forming a sequence of module antennas MAs at sites for antenna modules AMs may comprise some or all of the following steps, in generally (but not limited to) the following sequence . . .

The wire may be clamped by a clamping mechanism.
The wire may then be guided by the nozzle past a first pin 1a of a first pair (1a, 1b) of retractable fixation pins associated with a first (shown at the right) of the antenna modules AMs.
  The winding nozzle may be controlled by an x-y-z servo system (not shown)
The wire may then be guided past a first opening in the shuttle to a first of the winding cores WC associated with the first antenna module AM
  The openings in the shuttle may facilitate disconnection of the wire during bonding (occurs later)
The nozzle then moves (orbits) around the winding core WC, forming a predetermined number (such as 20) of turns of wire for the module antenna MA
The nozzle is then guided outwards, past the edge of the 35 mm carrier tape, passing over a second opening in the shuttle, to the second 1b of the first pair of retractable pins associated with the first antenna module
Then, rather than tying the wire off on the second pin 1b, the nozzle guides the wire partially (such as approximately 90 degrees) around the second pin 1b towards a first pin 2a of a next pair of pins (2a, 2b) associated with a next (second from the right) of the antenna modules. This partial wrap of the wire may be sufficient to anchor (secure) the wire to the pin 2a.
Then, the nozzle guides the wire around the pin 2a towards the wire core of the second (from the right) antenna module, passing over another opening in the shuttle.
The nozzle then moves (orbits) around the second winding core WC, forming a predetermined number (such as 20) of turns of wire for the module antenna MA.
The above steps (nozzle guided outward over an opening in the shuttle to a second pin of a pair of retractable pins, to a first pin of a next pair of retractile pins, wrapping partially around (securing the wire) and being guided inward over an opening in the shuttle to a next winding core, etc.) continues until a last winding core has been wound with a module antenna MA. Then the wire can be tied off (by the nozzle) around the second pin (4b) of the last pair of retractable pins (4a, 4b).
In FIG. 3A, the nozzle is shown exiting the third (from the right) winding core, headed towards the second of the pair of pins 3a, 3b associated with that antenna module site.
The end portions of the wire passing over respective bond pads BP may then be bonded, as described above with respect to FIG. 3.
In a last step, the wire can be cut, pins retracted, and residual wire removed.

Single-Flange Winding Core

FIG. 4 illustrates a winding core WC 420 upon which a module antenna MA may be wound. The winding core WC, which may be referred to as a "support structure", may be made of a plastic material, such as glass fiber reinforced PPS (Polyphenylene Sulfide). As with the dam structure DS 220, the winding core WC may be in the form of a ring, or tubular structure, having a circular or substantially rectangular cross-section, and two opposite open ends 420a, 420b, one of which ends will be secured (affixed) to the underside of a module tape MT, the other of which is a free end (un-mounted).

The winding core WC comprises a main body portion B 422, and a flange portion F 424 extending radially (to the left or right, as viewed) outward from the top (as viewed) free end of the body portion B. (This is in contrast with the dam DS 220 in which both ends are essentially the same as one another.)

The flange F serves to stiffen the body portion B, and also to constrain (contain) the windings of the module antenna MA as it is being wound. By way of analogy, when installed on the module tape MT, the flange F serves as one flange of a "bobbin", the surface of the module tape MT serves as the second flange of the "bobbin". The module antenna MA will be wound in a coil winding area between the two "bobbin" flanges. FIG. 4 shows a portion of the module tape MT in phantom (dashed lines), and indicates the coil winding area formed between the flange F and the underside surface of the module tape MT. (The module tape MT may be epoxy-glass, copper-clad on both sides, etched to form bond pads BP on the underside, contact pads CP on the face-up side.)

The winding core WC 420 may have the following dimensions (approximate):
  thickness t of the body portion B=~0.85 mm
  width fw of the flange F=~0.5 mm outer diameter OD of the winding core WC (including flange F)=~9.4 mm
inner diameter ID of the winding core WC=~6.7 mm
height h1 of coil winding area=~0.250 mm
height h2 of the flange F=~0.100 mm
overall height h3 of the body portion B=~0.350 mm The coil winding area between the flange F and the surface of the module tape MT may accommodate (contain) approximately 20 turns of 112 μm diameter self-bonding wire for the module antenna MA. Wire having other diameters, greater or less than 112 μm may be used for the module antenna MA.

Figure 4A:
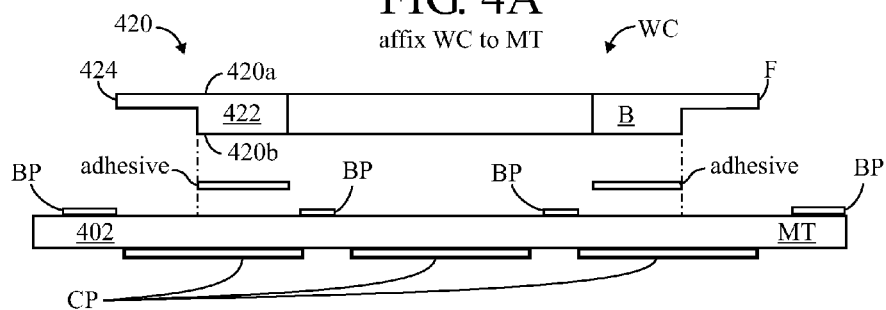
FIGS. 4A-4F are cross-sectional views of a technique for forming antenna modules (AMs), according to an embodiment of the invention.

A process for forming a module antenna MA 430 on the winding core WC, further forming an antenna module AM is described with respect to FIGS. 4A-4F, and generally comprises:
    fix WC to MT
    wind MA on WC
    dispense adhesive for the CM
    place CM, cure adhesive (cure self-bonding wire)
    wire bonding (CM and MA to BPs on MT)
    glob top fill interior of WC (covering CM)
    overmold MA, WC, CM FIG. 4A illustrates a first step, wherein the winding core WC 420 is affixed to the module tape MT, such as with an adhesive. The adhesive may be applied to either of the end 420b of the winding core WC or the surface of the module tape MT. The final thickness of the adhesive may be approximately 30 μm. Alternatively, the winding core WC may be affixed to the module tape MT without adhesive, such as by spin-welding (a frictional welding technique). In a production process, a winding core WC (or simply "ring") may be placed at a plurality of locations along a 35 mm carrier tape in preparation for coil winding (winding of the module antenna MA on the winding core WC, or dam DS). This step may be referred to as "ring placement".

Contact pads CPs (compare 104) for a contact interface (with an external reader) are shown in on the face-up (bottom, as viewed) surface of the module tape MT, for a dual interface (DI) antenna module AM. However, is should be understood that the invention can be practiced in the context of an antenna module AM that operates solely in contactless mode, without such contact pads CP.

Figure 4B:

FIG. 4B illustrates the winding core WC affixed (assembled, mounted) to the module tape MT. A coil winding area is formed between the flange F and the surface of the module tape MT. In this and in subsequent figures, the adhesive is omitted, for illustrative clarity.

Figure 4C:
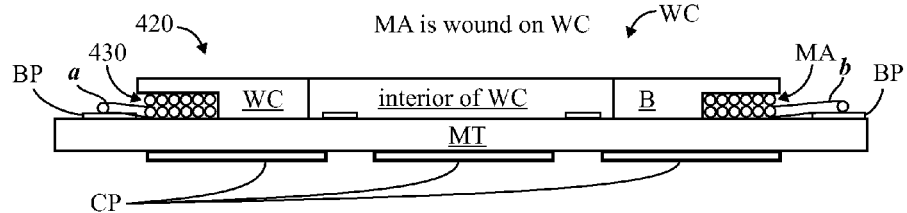

FIG. 4C illustrates a next step, wherein the module antenna MA 430 is wound on the winding core WC, around the body portion B, in the coil winding area between the flange F and the surface of the module tape MT. This may be done in the manner shown in and described with respect to FIG. 3 (using the "flyer" winding technique). Other coil winding techniques may be used to form the coils of the module antenna MA. The ends (a, b) of the module antenna MA, extending outward from the winding core WC, may be connected with respective bond pads BP in this step. Although not shown, the winding core 420 may have at least one slot (S), comparable to the at least one slot (S) shown in FIG. 2B, to allow the ends (a, b) of the module antenna MA to extend to bond pads (BP) located the inside of the winding core WC.

The coils (turns) of wire may not be so neatly arranged, as illustrated. Nevertheless, the coils (turns) of wire are constrained within the coil winding area by the flange F and the surface of the module tape MT, as shown. The module antenna MA may comprise a total of 20 turns (coils) of wire in the coil winding area, and two ends (a, b) extending over respective bond pads BP on the surface of the module tape MT.

Figure 4D:
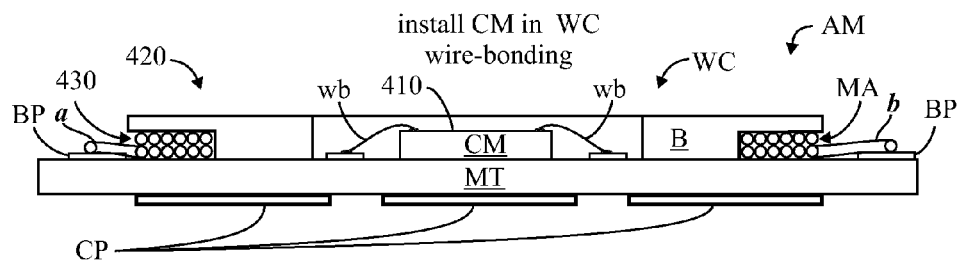

FIG. 4D illustrates a next step of forming the antenna module MA, wherein the chip CM (compare 110) is installed in the interior area of the winding core WC. Then, wire bonds wb (compare 114a, 114b) may be formed between the terminals (compare 110a, 110b) of the chip 110 and selected ones of the bond pads BP on the surface of the module tape MT. The ends (a, b) of the module antenna MA may also be bonded to the selected ones of the bond pads BP on the surface of the module tape MT in this step, if they were not previously connected.

Figure 4E:
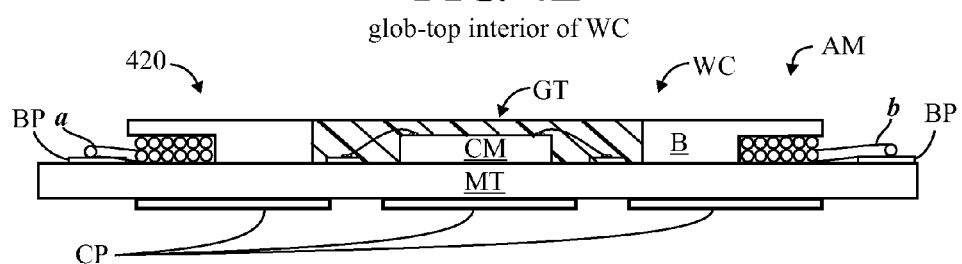

FIG. 4E illustrates a next step, wherein the interior area of the winding core WC may be filled with glob-top potting compound GT, or the like, to protect the chip CM and wire bonds wb. If heat is applied to cure the glob-top GT, the heat may also cause sticking together of the self-bonding wire forming the turns (coils) of the module antenna MA.

Figure 4F:
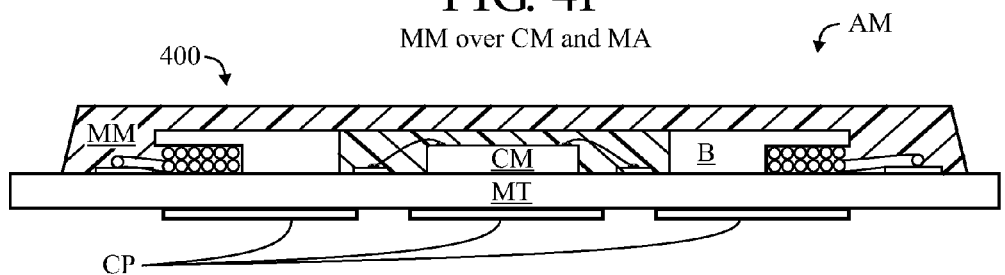

FIG. 4F illustrates a next step, wherein a mold mass MM may be formed (by overmolding) over the module antenna MA, the ends (a, b) of the module antenna MA, the winding core WC, the glob-top GT (including over the chip CM and wire bonds). The mold mass MM may extend over the outer edge (lip) of the flange F, slightly into the coil winding area (except where there is wire), which may helping retain the mold mass MM in place. To a lesser extent, the dam structure DS (FIG. 2), which is also affixed at one end to the module tape MT, if used in lieu of the winding core WC, may also help to support (retain, capture) the mold mass MM.

The process of forming a module antenna MA for an antenna module AM described above may be contrasted with Toppan '774 which shows (FIG. 14) a coil wound around a coil frame or core having flanges mounted around the epoxy resin protecting the die and wire bonds to the die. For example, in the technique described above (FIGS. 4A-4F) . . .
    the winding core WC has only one flange (the other "virtual" flange at the opposite open end of the support structure being the surface of the module tape MT),
    the tubular support structure (WC, DS) may serve as a dam for containing later-applied glob-top GT resin,
    the chip CM may be installed after the module antenna MA is formed upon the module tape MT (and the wire bonds to the chip CM also being performed after bonding the ends of the module antenna MA)

Figure 5:
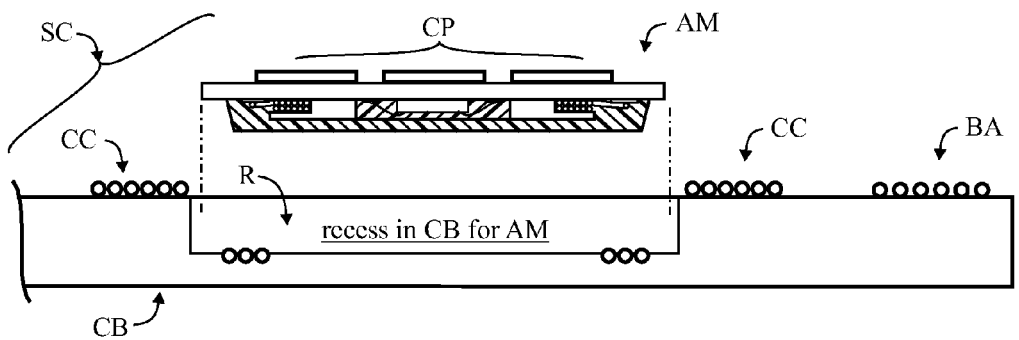
FIG. 5 is an exploded cross-sectional view showing an antenna module (AM) being installed in a card body (CB) of a smart card (SC).

FIG. 5 (compare FIG. 1) illustrates the antenna module AM, which could be the antenna module 200 of FIG. 2 or the antenna module AM 400 of FIG. 4F, installed in a recess R in a card body CB of a smart card SC having a booster antenna BA having an outer portion at the periphery of the card body and a coupler coil CC at an interior area of the card body, such as surrounding the recess R. At least some (including all) of the turns of wire of the coupler coil CC may be embedded in the bottom of the recess R, to enhance the inductive (transformer) coupling between the coupler coil CC and the module antenna MA. Channels or a wide trench for receiving the turns of wire in the bottom of the recess R may be formed by laser ablation.

Some Manufacturing Processes and Embodiments

Figure 6A:
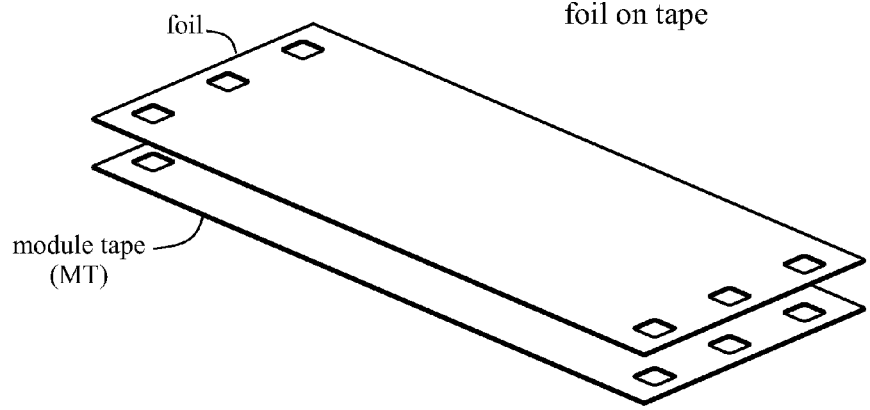
FIGS. 6A, 6B, 6C, 6D are perspective views of steps involved in a method for making antenna modules (AMs), according to some embodiments of the invention.
Figure 6B:
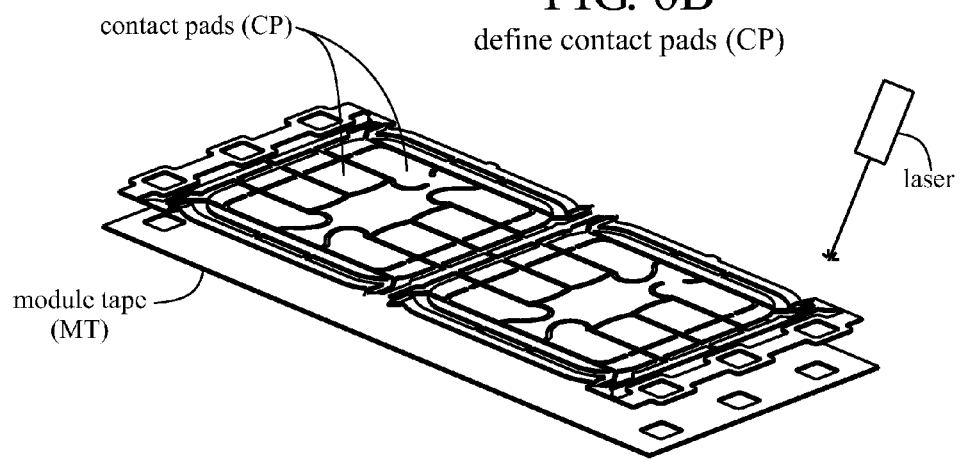

FIG. 6A illustrates a first step in an exemplary manufacture and assembly of an antenna module (AM) comprising:
    copper foil with gold, nickel or palladium plating,
    module tape (MT) such as conventional "super 35 mm" tape Holes may be provided through the tape, for connecting from the opposite side of the tape to the underside of the foil, as described hereinbelow FIG. 6B illustrates a further step in the manufacture and assembly of the antenna module (AM). The foil may be laser etched to have a number (such as six) of contact pads (CP) for a contact interface (ISO-7816). This is the familiar terminal block of contacts seen on the "face-up" side of many bank cards and the like. On the opposite side (underside) of the module tape MT, an RFID chip CM and module antenna MA will be provided.

Figure 6C:
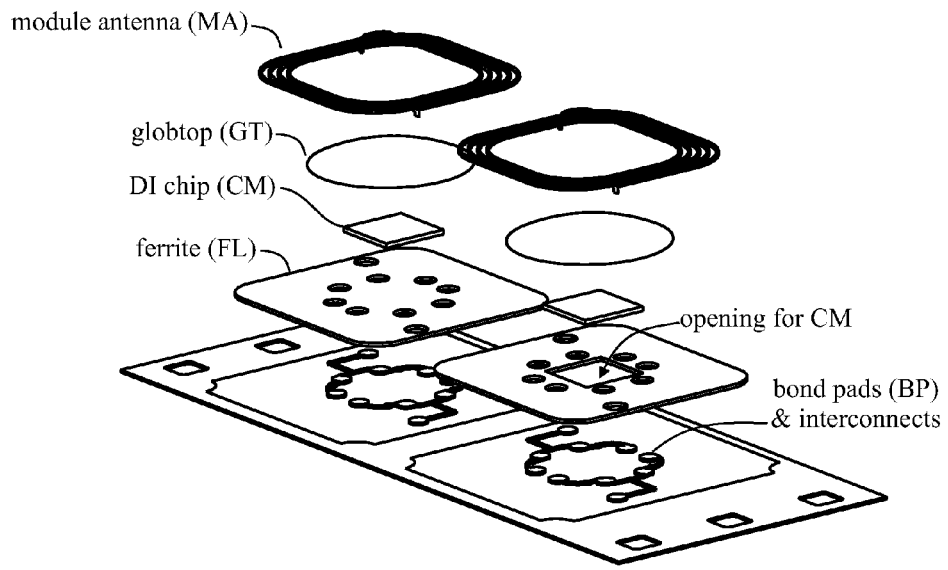
Figure 6D:
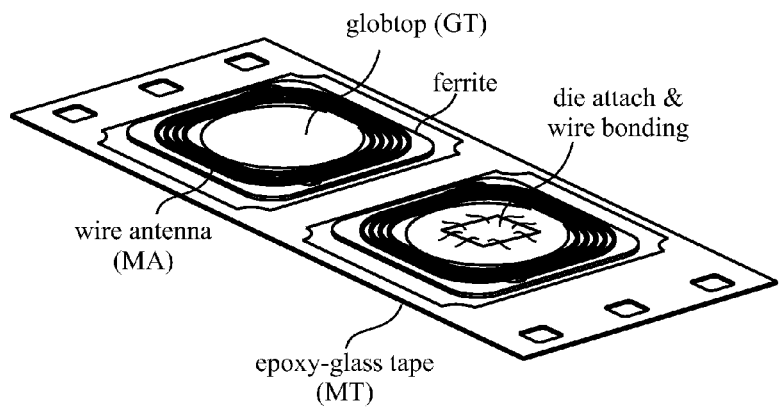

FIGS. 6C, 6D illustrate the opposite side of the module tape MT. Foil on this underside of the module tape MT may be patterned to have interconnects and bond pads (BP). The chip CM may be mounted to the underside of the module tape MT and connected such as with wire bonds to selected ones of the bond pads. Conductive vias may be formed through the module tape MT to connect the chip CM to the contact pads (CP) on the face-up top side of the module tape MT (see FIG. 6B). A module antenna MA may be mounted to the underside of the module tape MT with its ends (a, b) connected to bond pads (BP), thereby connecting the module antenna MA with the chip CM. Glob-top GT (a conformal coating of resin) may be applied to protect the chip CM and its wire bonds, the module antenna MA acting as a dam for the glob-top. Alternatively, the module antenna MA can be mounted onto the mold mass (glob-top) of the antenna module AM as a flat antenna structure. Any of the module antenna MA techniques described above may be used. A ferrite layer FL may be provided, with holes for interconnects (such as wire bonds to the chip CM) to be made therethrough. FIG. 6C illustrates (right side only) that an opening may be provided through the ferrite layer FL to accommodate the chip CM.

An Antenna Module (AM) having a Double-Sided Module Tape (MT)

The contact pads CP may be formed in a top metal TM layer (or "contact surface") on the face-up side (top surface) of the module tape MT, such as an epoxy-glass or Kapton® tape. Bond pads (BP) and conductive traces for interconnects may be formed in a bottom metal BM layer on the underside of the module tape MT. The tape format may be Super 35 mm tape, electroplated Cu on glass epoxy tape. Some exemplary materials and dimensions (all approximate) may be:

Base material: glass epoxy 110 µm thick

Top and Bottom conductive layers (metallization):
copper (Cu) foil (or "seed layer"): 35 µm thick
adhesive layer between copper foil and epoxy tape: 18 µm thick
Nickel (Ni) plating on face-up (contacts CP) side: minimum of 1.4 µm thick
Nickel (Ni) plating on underside (bonding side): minimum of 3 µm thick
Gold (Au) plating on face-up (contacts CP) side: minimum of 0.03 µm thick
Gold (Au) plating on underside (bonding side): minimum of 0.2 µm thick
Total thickness (tape, glue, copper, nickel, gold) 195 µm±20 µm
Bond Wire: gold (Au), Ø 25 µm There may be 8 contact pads CP (C1-C8, designated by ISO 7816 part 2). The contact pads CP (C1, C2, C3, C5, and C7) may be connected with the chip CM. The contact pads (such as "C4" and "C8" in, which are reserved), or additional metallization on the top surface of the module tape MT may be used for interconnect, rather than for contact interface to an external contact reader. The top metal layer, on the "face up" side may comprise Cu/Ni/Au, having a total thickness of approximately 36 µm. The bottom metal layer (metallization) may comprise Cu/Ni/Au, having a total thickness of approximately 38 µm, patterned to have areas (bond pads BP) for receiving wire bonds from the chip CM and the module antenna MA.

Such a module tape MT may be referred to as "double-sided", meaning that it has metallization on both the top and bottom surfaces thereof. Conductive vias may be provided through the module tape MT, extending from portions (such as bond pads BP) of the metallization on the bottom surface to corresponding portions (such as contact pads CP) of the metallization on the top surface to establish electrical connections therebetween.

Figure 7A:
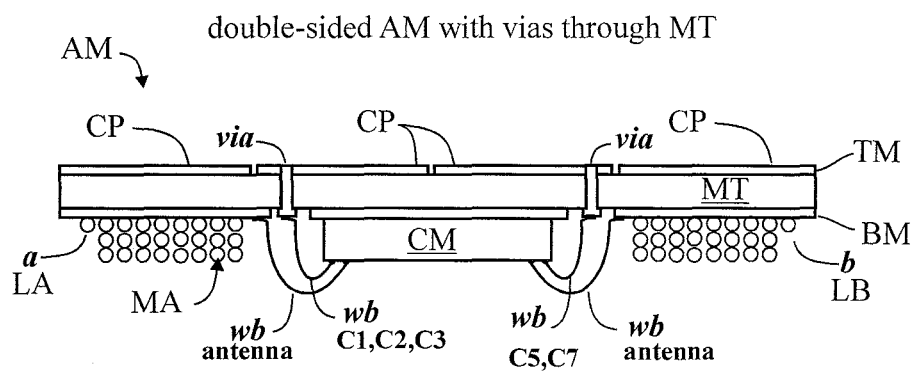
FIG. 7A is a cross-sectional view of an antenna module (AM) having a double-sided module tape (MT) with vias extending through the module tape (MT).

FIG. 7A shows an antenna module AM having a double-sided tape, with vias through the module tape MT for connecting the chip CM to the appropriate contact pads CP on the face-up side of the module tape MT.

The chip CM may be connected, as illustrated, by wire bonds wb to vias associated with the contact pads CP disposed on the top surface of the module tape MT. Ends (a, b) of the module antenna MA may be connected to interconnect traces in the bottom metallization. The chip CM may also be connected by wire bonds wb to these traces to effect connection of the module antenna MA with the chip CM. For the wire bonds wb, one end of a bond wire may ultrasonically bonded (ball bond) to a chip terminal (CT) or pad on the chip CM, the other end of the bond wire may be ultrasonically bonded (wedge bond) to the bond pad or interconnect trace on the bottom metallization.

The module antenna MA is shown having several turns of wire, such as in a 3×8 configuration (3 layers, each layer having 8 turns), and having two ends (a, b). The ends (a, b) may be thermo compression (TC) bonded to exposed surfaces on the bottom metal layer. The module antenna MA may be attached to the module tape MT with Nitrile (support film 132, FIG. 1C), which may also used to attach the antenna module AM to a card body CB. The Nitrile may cover the module antenna (i.e., the antenna is under the nitrile layer, not above it) and may also be attached to the back side of the module tape MT.

Figure 7B:
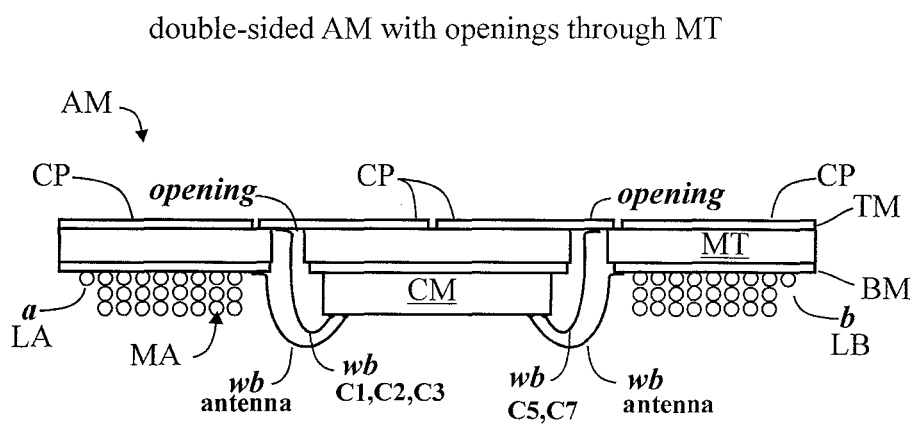
FIG. 7B is a cross-sectional view of an antenna module (AM) having a double-sided module tape (MT) with openings extending through the module tape (MT).

FIG. 7B illustrates an antenna module AM having a double-sided tape, with openings (rather than vias) through the module tape MT for connecting the chip (via wire bonds) directly (without intervening vias) to the underside of corresponding contact pads CP on the face-up side of the module tape MT.

In FIGS. 7A and 7B, the module antenna MA may be connected to traces in the metal layer LB on the underside of the module tape MT, and selected terminals of the chip CM may be wire bonded to those traces on the bottom metallization LB.

Figure 7C:
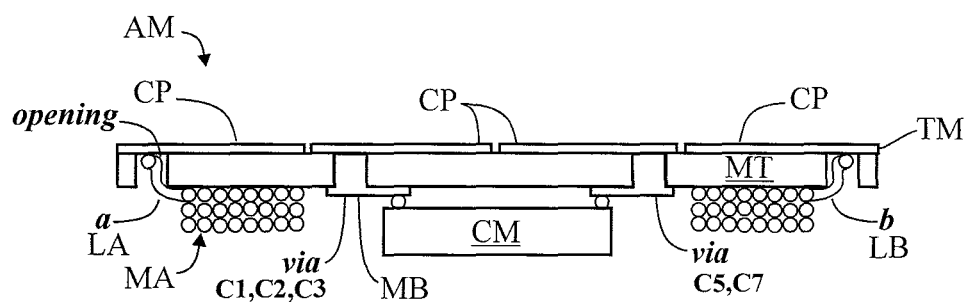
FIG. 7C is a cross-sectional view of an antenna module (AM) having a double-sided module tape (MT) with vias and openings extending through the module tape (MT).

FIG. 7C illustrates an antenna module AM having a double-sided tape, with openings in the module tape MT for the connection of the ends (a, b) of the module antenna MA to the undersides of contact pads CP (or other areas of top metallization). The bottom metallization BM may be removed from under the module antenna MA since it is not needed for interconnecting the module antenna MA with the chip CM. Conductive vias are provided through the module tape MT for connecting the chip CM to contact pads CP. Here it is shown that rather than wire-bonding the chip CM to the vias (as in FIG. 7A), the chip CM may be flip-chip (ball) bonded to selected traces in the bottom metal layer MB which are associated with those vias. Underfiller may be provided under (on top, as viewed) of the chip CM to support it on and secure it to the module tape MT.

Figure 7D:
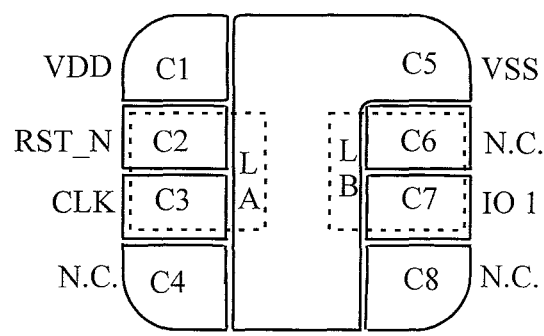
FIG. 7D is a diagram showing exemplary contact pad (CP) layout/assignments for the antenna modules (AM) of any of FIGS. 7A to FIG. 7C.

FIG. 7D illustrates contact pad layout/assignments relevant to FIGS. 7A-7C. The wire ends (a, b) of the module antenna MA may be connected to LA and LB on the underside of the module tape MT.

It may be advantageous to remove metal, such as by laser ablation (or laser percussion drilling) from the contact pads CP of the antenna module AM to improve the electromagnetic coupling (read distance) with a external contact reader (FIG. 1). This removal of metal from the contact pads (CP) can take various forms, such as a providing a plurality of perforations through selected ones of the contact pads, modifying the size of selected ones of the contact pads, or increasing the size of a gap between selected ones of the contact pads CP, or the like, such as may be described in 61/693,262 filed Aug. 25, 2012 ("s48pp3").

Single-Sided Tape

Figure 7E:
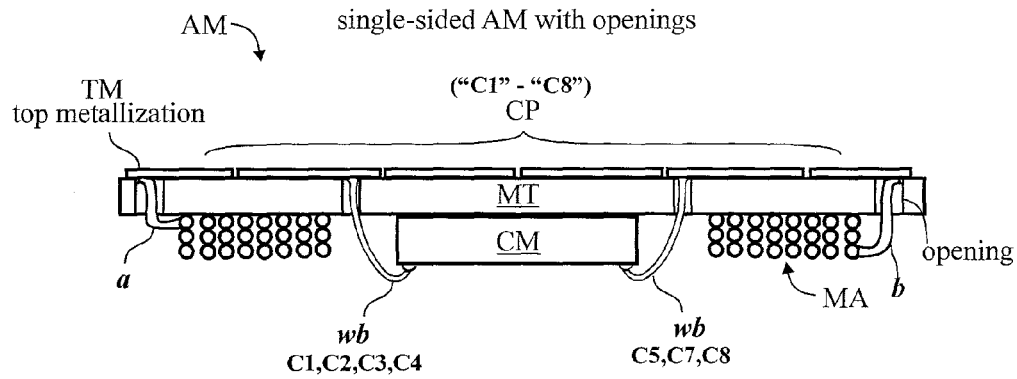
FIG. 7E is a cross-sectional view of an antenna module (AM) having a single-sided module tape with openings extending through the module tape (MT).

FIG. 7E is a cross-sectional view of an antenna module AM having a single-sided module tape MT. Metallization is provided on only the top surface (face-up side) of the module tape MT, and patterned to have contact pads CP in the manner described hereinabove. Openings are provided through the module tape (MT) to accommodate connecting the chip CM to selected ones of the contact pads CP (compare FIG. 7B, openings accommodating direct connection of wire bonds from the chip CM to the underside of contact pads C1, C2, C3, C5, C7). The ends (a, b) of the module antenna MA may also be connected to the underside of contact pads (such as C4, C8) so as to ultimately be connected with the chip CM.

Figure 7F:
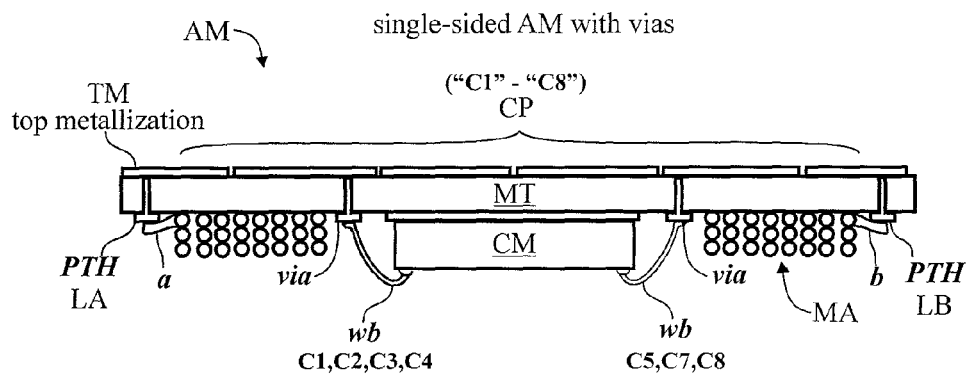
FIG. 7F is a cross-sectional view of an antenna module (AM) having a single-sided module tape with vias extending through the module tape (MT).

FIG. 7F is a cross-sectional view of an antenna module (AM) having a single-sided tape. In this embodiment, plated through holes PTH are provided through the module tape MT. The chip CM and ends (a, b) of the module antenna MA may be bonded to bottom ends of the plated through holes, as illustrated. Generally, the plated through holes PTH serve essentially the same functon as the vias previously discussed, for example with respect to FIGS. 7A, 7C.

Figure 7G:
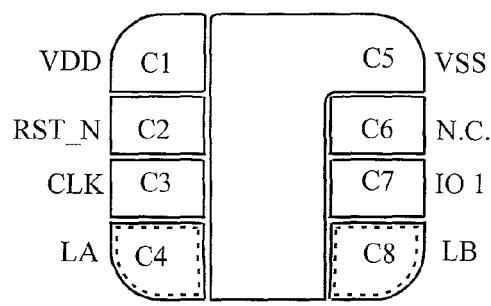
FIG. 7G is a diagram showing exemplary contact pad (CP) layout/assignments for the antenna modules (AM) of either of FIG. 7E and FIG. 7F.

FIG. 7G illustrates contact pad layout/assignments for the single-sided tape of FIG. 7E and FIG. 7F. In order to use single sided tape, all connections (wire bonds and antenna wire connections) need to be connected to the backside of the contact pads CP on the face up side of the tape. In the case of the module antenna MA, the wire ends (a, b) of the antenna could be connected to contact pads C4 and C8, as well as the respective wire bonds from the chip CM.

Regarding embodiments (FIGS. 7B, 7E) described above, showing connecting the chip CM to contact pads CP through openings in the module tape MT, the bond wire for making these wire bonds wb may be 80 μm wire. The openings through the module tape MT may have a cross-dimension (such as diameter) of 2000 μm (2 mm). The openings through the module tape MT for connecting the ends (a, b) of the module antenna MA to the underside of top metallization (FIG. 7C) may similarly have a cross-dimension (such as diameter) of 2000 μm (2 mm).

While the invention(s) has/have been described with respect to a limited number of embodiments, these should not be construed as limitations on the scope of the invention(s), but rather as examples of some of the embodiments. Those skilled in the art may envision other possible variations, modifications, and implementations that are also within the scope of the invention(s), based on the disclosure(s) set forth herein.

What is claimed is:

1. An antenna module (AM) for a smart card (SC) comprising:
   a module tape (MT);
   a chip (CM) disposed on a surface of the module tape (MT); and
   a module antenna (MA) disposed on the surface of the module tape (MT), and connected with the chip (CM);
   characterized by:
   a support structure (DS, WC) secured to the surface of the module tape (MT), serving as a winding core for the module antenna (MA) and as a dam for glob-top (GT) covering the chip (CM);
   wherein the support structure (DS, WC) comprises a tubular body portion (B) having two opposite open ends, one of which is secured to the surface of the module tape (MT), the other of which is a free end; and
   the support structure (WC) has only one flange (F) which is disposed around the free end of the body portion (B) and the end of the support structure (WC) which is secured to the module tape (MT) does not have a flange.

2. The antenna module (AM) of claim 1, wherein:
   the support structure has a flange (F) disposed around the free end of the body portion (B).

3. The antenna module (AM) of claim 1, wherein:
   the module antenna (MA) is disposed external to the body portion (B); and
   the chip (CM) is disposed on the module tape (MT) internal to the body portion (B);
   further comprising:
   at least one slot (S) extending through the body portion (B) to allow corresponding at least one end of the module antenna (MA) to pass through the body portion (B) from external the body portion (B) to internal the body portion (B).

4. The antenna module (AM) of claim 1, further comprising:
   glob-top (GT) covering at least the chip (CM), within the support structure.

5. The antenna module (AM) of claim 1, further comprising:
   a mold mass (MM) covering the chip (CM), the support structure (DS, WC) and the module antenna (MA).

6. The antenna module (AM) of claim 1, further comprising:
   contact pads (CP) on an opposite surface of the module tape (MT) for a contact interface.

7. A smart card (SC) comprising the antenna module (AM) of claim 1, and further comprising:
   a card body (CB);
   a booster antenna (BA) having an outer portion disposed around a periphery of the card body (CB); and
   a coupler coil (CC) disposed at an interior area of the card body (CB);
   wherein the antenna module (AM) is disposed at the interior area of the card body (CB) for inductive coupling of the module antenna (MA) with the coupler coil (CC).

8. The smart card (SC) of claim 7, wherein:
   a recess (R) is provided in the card body (CB) for receiving the antenna module (AM).

9. The smart card (SC) of claim 8, wherein:
   at least a portion of the coupler coil (CC) is embedded in the recess (R).

10. A method of making an antenna module (AM) comprising:
    affixing a tubular support structure (DS, WC) having two opposite open ends on a surface of a module tape (MT);

after affixing the support structure to the module tape, filling an interior area of the support structure with glob-top potting compound (GT) to protect a chip (CM) disposed therein; and after affixing the support structure to the module tape, winding a wire for a module antenna (MA) around the tubular support structure (DS, WC).

11. The method of claim 10, further comprising:
winding the module antenna (MA) using a flyer winding technique.

12. The method of claim 10, further comprising, before winding the wire around the support structure:
securing a first end of the wire for forming the module antenna (MA) to a first pin; and
passing a first end portion of the wire over a first bond pad (BP) on the module tape (MT).

13. The method of claim 12 further comprising, after winding the wire around the support structure:
passing a second end portion of the wire over a second bond pad (BP) on the module tape (MT); and
securing a second end of the wire for forming the module antenna (MA) to a second pin.

14. The method of claim 13, further comprising:
connecting the first and second end portions to the first and second bond pads.

15. A method of making an antenna module (AM) comprising:
mounting a module antenna (MA) to a module tape (MT);
mounting and connecting a chip (CM) to the module tape (MT);
covering the chip (CM) and its connections with resin (GT);
characterized by:
the chip (CM) and its connections are covered with resin (GT) by filling an interior area of the module antenna (MA) with resin after mounting the module antenna (MA) and after mounting and connecting the chip (CM).

16. An antenna module (AM) for a smart card (SC) comprising:
a module tape (MT) having a top surface and a bottom surface;
contact pads (CP) for a contact interface disposed on the top surface;
a chip (CM) disposed on the bottom surface of the module tape (MT); and
a module antenna (MA) disposed on the bottom surface of the module tape (MT);
further comprising:
openings extending through the module tape (MT) from the bottom surface to the top surface thereof for connecting at least one of ends (a, b) of the module antenna and wire bonds (wb) extending from terminals (CT) of the chip (CM) to back surfaces of selected ones of the contact pads.

17. The antenna module (AM) of claim 16, wherein:
the module tape has metallization on both of the top and bottom surfaces.

18. The antenna module (AM) of claim 17, wherein:
the module tape has vias extending from portions of the metallization on the bottom surface to corresponding portions of the metallization on the top surface.

19. The antenna module (AM) of claim 16, wherein:
the module tape has metallization on only the bottom surface.

20. The antenna module (AM) of claim 19, wherein:
the module tape has plated through holes extending from the bottom surface to portions of the metallization on the top surface.

* * * * *